US012543347B2

(12) United States Patent
Hong et al.

(10) Patent No.: US 12,543,347 B2

(45) Date of Patent: Feb. 3, 2026

(54) DIFFERENT DIFFUSION BREAK STRUCTURES FOR THREE-DIMENSIONAL STACKED SEMICONDUCTOR DEVICE

(71) Applicant: SAMSUNG ELECTRONICS CO., LTD., Suwon-si (KR)

(72) Inventors: Byounghak Hong, Albany, NY (US); Seunghyun Song, Albany, NY (US); Kang-ill Seo, Albany, NY (US)

(73) Assignee: SAMSUNG ELECTRONICS CO., LTD. (KR)

(*) Notice: Subject to any disclaimer, the term of this patent is extended or adjusted under 35 U.S.C. 154(b) by 447 days.

(21) Appl. No.: 18/316,005

(22) Filed: May 11, 2023

(65) Prior Publication Data

US 2023/0282646 A1 Sep. 7, 2023

Related U.S. Application Data

(62) Division of application No. 17/335,834, filed on Jun. 1, 2021, now Pat. No. 11,688,742.

(Continued)

(51) Int. Cl.

*H10D 30/67* (2025.01)
*H10D 62/10* (2025.01)

(Continued)

(52) U.S. Cl.

CPC ....... *H10D 30/6735* (2025.01); *H10D 62/121* (2025.01); *H10D 84/0188* (2025.01);

(Continued)

(58) Field of Classification Search

CPC ............... H10D 86/201; H10D 62/121; H10D 84/0188; H10D 84/038; H10D 86/215;

(Continued)

(56) References Cited

U.S. PATENT DOCUMENTS 9,831,272 B2 11/2017 Chen et al.
10,141,403 B1 * 11/2018 Cheng .................. H10D 62/121

(Continued)

FOREIGN PATENT DOCUMENTS

KR 20200032224 A 3/2020

*Primary Examiner* — Nelson Garces

(74) *Attorney, Agent, or Firm* — Myers Bigel, P.A.

(57) ABSTRACT

A multi-stack semiconductor device formed to cover a plurality of gate pitches includes: a $1^{st}$ transistor; a $2^{nd}$ transistor formed at a right side of the $1^{st}$ transistor, and isolated from the $1^{st}$ transistor by a $1^{st}$ portion of a diffusion break structure; a $3^{rd}$ transistor formed vertically above or below the $1^{st}$ transistor; and a $4^{th}$ transistor formed at a right side of the $3^{rd}$ transistor, and isolated from the $3^{rd}$ transistor by a $2^{nd}$ portion of the diffusion break structure, wherein the $1^{st}$ portion and the $2^{nd}$ portion of the diffusion break structure are formed of different material compositions or have different physical dimensions.

20 Claims, 12 Drawing Sheets

Related U.S. Application Data

(60) Provisional application No. 63/163,432, filed on Mar. 19, 2021.

(51) Int. Cl.
*H10D 84/01* (2025.01)
*H10D 84/03* (2025.01)
*H10D 86/00* (2025.01)

(52) U.S. Cl.
CPC ......... *H10D 84/038* (2025.01); *H10D 86/201* (2025.01); *H10D 86/215* (2025.01)

(58) Field of Classification Search
CPC ........... H10D 30/6757; H10D 30/6735; H10D 30/014; H10D 30/43; H10D 84/85; H10D 84/0167; H10D 88/00; H10D 88/01; H10D 62/115; H10D 84/0172; B82Y 10/00
See application file for complete search history.

(56) References Cited

U.S. PATENT DOCUMENTS

| | | | | |
|---|---|---|---|---|
| 10,263,100 | B1* | 4/2019 | Bi | H10D 62/364 |
| 10,388,519 | B2 | 8/2019 | Smith et al. | |
| 10,396,076 | B2 | 8/2019 | Jagannathan et al. | |
| 10,833,078 | B2 | 11/2020 | Smith et al. | |
| 10,840,244 | B2 | 11/2020 | Maeda et al. | |
| 2018/0197785 | A1* | 7/2018 | Cheng | H10D 30/6757 |
| 2019/0057867 | A1* | 2/2019 | Smith | H01L 21/32133 |
| 2019/0131395 | A1 | 5/2019 | Lee et al. | |
| 2020/0235134 | A1 | 7/2020 | Lilak et al. | |
| 2021/0217873 | A1* | 7/2021 | Siddiqui | H10D 30/43 |
| 2022/0199624 | A1* | 6/2022 | Huang | H10B 53/30 |
| 2022/0238520 | A1* | 7/2022 | Gardner | H10D 30/6757 |

* cited by examiner

2000

DIFFERENT DIFFUSION BREAK STRUCTURES FOR THREE-DIMENSIONAL STACKED SEMICONDUCTOR DEVICE

CROSS-REFERENCE TO RELATED APPLICATION

This is a Divisional of U.S. application Ser. No. 17/335,834 filed Jun. 1, 2021, which is based on and claims priority from U.S. Provisional Application No. 63/163,432 filed on Mar. 19, 2021 in the U.S. Patent and Trademark Office, the disclosure of which is incorporated herein in its entirety by reference.

BACKGROUND

1. Field

Apparatuses and methods consistent with example embodiments of the inventive concept relate to a diffusion break structure of a semiconductor device, and particularly, to a stacked semiconductor device having different diffusion break structures.

2. Description of the Related Art

A diffusion break structure is necessary to isolate two horizontally adjacent semiconductor devices in an array of semiconductor devices. The diffusion break structure may be formed in a shallow trench isolation (STI) region disposed between active regions of the two semiconductor devices on a substrate in the semiconductor device array.

FIG. 12 illustrates a plan view of a related art semiconductor device array including a single diffusion break (SDB) structure and a double diffusion break (DDB) structure.

Referring to FIG. 12, a semiconductor device array 12 includes a plurality of gate structures PC1 through PC6 arranged at a predetermined interval of a gate pitch GP across an active region RX extended in a D1 direction above a substrate 105. In the semiconductor device array 12, $1^{st}$ to $3^{rd}$ transistors TR1, TR2 and TR3 are formed from the gate structures PC1, PC4 and PC6. Each of the $1^{st}$ to $3^{rd}$ transistors TR1, TR2 and TR3 may be a fin field-effect transistor (finFET) or a nanosheet transistor, which also goes by various different names such as multi-bridge channel FET (MBCFET), nanobeam, nanoribbon, superimposed channel device, etc. The active region RX form fin structures penetrating the gate structures PC1 through PC6 to function as channels for current flow in each of the $1^{st}$ to the $3^{rd}$ transistors TR1, TR2 and TR3 when source/drain regions are formed at both sides of the gate structures PC1, PC4 and PC6 on the active region RX.

The semiconductor device array 12 further includes a DDB structure isolating the $1^{st}$ transistor TR1 and the $2^{nd}$ transistor TR2 from each other, and an SDB structure isolating the $2^{nd}$ transistor TR2 and the $3^{rd}$ transistor TR3 from each other. As shown in FIG. 12, the SDB structure is formed at a space where the gate structure PC5 is removed, and thus, occupies approximately a space of one gate structure in a D1 direction, which is a channel length direction. In contrast, the DDB structure is formed to remove at least a portion of the gate structures PC2 and PC3 and an active region RX therebetween, and thus, occupies a space of approximately one gate pitch in the D1 direction. Thus, the SDB structure may be employed in integrated circuits requiring a higher device density. However, the DDB structure may be more easily formed than the SDB structure because of its relatively large size, and also may achieve a better isolation performance than the SDB structure.

The diffusion break structure such as the DDB and the SDB shown in FIG. 12 has been widely used in forming an array of planar transistors as well as gate-all-around transistors such as fin field-effect transistor (finFET) and nanosheet transistor as described above. However, it is noted that the diffusion break structure may also be formed to isolate different types of semiconductor devices as described in the present disclosure. In addition, it is noted that the diffusion break structure may be used to control stress applied to a channel region as well as source/drain regions of the transistors isolated by the diffusion break structure, and thus, researches have been conducted to more effectively form the diffusion break structure for enhanced control of stress of the transistors.

Information disclosed in this Background section has already been known to the inventors before achieving the disclosure of the present application or is technical information acquired in the process of achieving the disclosure. Therefore, it may contain information that does not form the prior art that is already known to the public

SUMMARY

The disclosure provides various multi-stack semiconductor devices including diffusion break structures formed of different material compositions and/or different physical dimensions depending on the type of stress to be applied to transistors formed at both sides of the diffusion break structure.

According to an embodiment, there is provided a multi-stack semiconductor device that may include: a $1^{st}$ multi-stack transistor including a $1^{st}$ lower transistor and a $1^{st}$ upper transistor formed above the $1^{st}$ lower transistor; a $2^{nd}$ multi-stack transistor including a $2^{nd}$ lower transistor and a $2^{nd}$ upper transistor formed above the $2^{nd}$ lower transistor, the $2^{nd}$ multi-stack transistor being disposed at a side of the $1^{st}$ multi-stack transistor in a $1^{st}$ direction; and a diffusion break structure including: a lower portion configured to isolate the $1^{st}$ lower transistor from the $2^{nd}$ lower transistor; and an upper portion configured to isolate the $1^{st}$ upper transistor from the $2^{nd}$ upper transistor, wherein the lower portion of the diffusion break structure has a material composition different from a material composition of the upper portion of the diffusion break structure.

According to an embodiment, there is provided a multi-stack semiconductor device formed to cover a plurality of gate pitches. The multi-stack semiconductor device may include: a $1^{st}$ transistor; a $2^{nd}$ transistor formed at a right side of the $1^{st}$ transistor, and isolated from the $1^{st}$ transistor by a $1^{st}$ portion of a diffusion break structure; a $3^{rd}$ transistor formed vertically above or below the $1^{st}$ transistor; and a 4th transistor formed at a right side of the 3rd transistor, and isolated from the $3^{rd}$ transistor by a $2^{nd}$ portion of the diffusion break structure, wherein the $1^{st}$ portion of the diffusion break structure covers a space corresponding to approximately one gate pitch or more in a $1^{st}$ direction, and the $2^{nd}$ portion of the diffusion break structure covers a space corresponding to approximately one gate structure or dummy gate structure or less in the $1^{st}$ direction.

According to an embodiment, there is provided a multi-stack semiconductor device formed to cover a plurality of gate pitches. The multi-stack semiconductor device may include: a $1^{st}$ transistor; a $2^{nd}$ transistor formed at a right side of the $1^{st}$ transistor, and isolated from the $1^{st}$ transistor by a $1^{st}$ portion of a diffusion break structure; a $3^{rd}$ transistor formed vertically above or below the $1^{st}$ transistor; and a 4th transistor formed at a right side of the 3rd transistor, and isolated from the $3^{rd}$ transistor by a $2^{nd}$ portion of the diffusion break structure, wherein the $1^{st}$ portion and the $2^{nd}$ portion of the diffusion break structure are formed of different material compositions or have different physical dimensions.

BRIEF DESCRIPTION OF DRAWINGS

Example embodiments will be more clearly understood from the following detailed description taken in conjunction with the accompanying drawings in which.

DETAILED DESCRIPTION

Figure 1A:
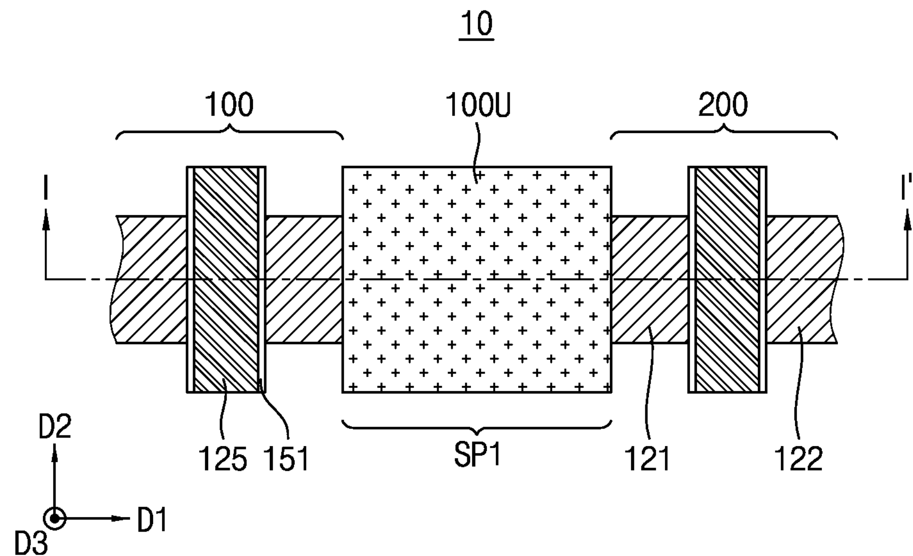
FIG. 1A illustrates a top plan view of a multi-stack semiconductor device including a plurality of multi-stack nanosheet transistors and a double diffusion break (DDB) structure, according to an embodiment.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. In addition, terms such as a "row" and a "column" of an array, in which a plurality of semiconductor structures are arranged, may be interpreted as a "column" and a "row" when the array is rotated 90 degrees.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, although in an embodiment of manufacturing an inventive apparatus or structure, a step or operation is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to a semiconductor device including a fin field-effect transistor (finFET) and a nanosheet transistor may or may not be described in detail herein when those elements are not related to the inventive concept. Further, even if those conventional elements are described, their specific structures or materials forming thereof may not be described herein when those structures or materials are not related to the inventive concept.

Figure 1B:
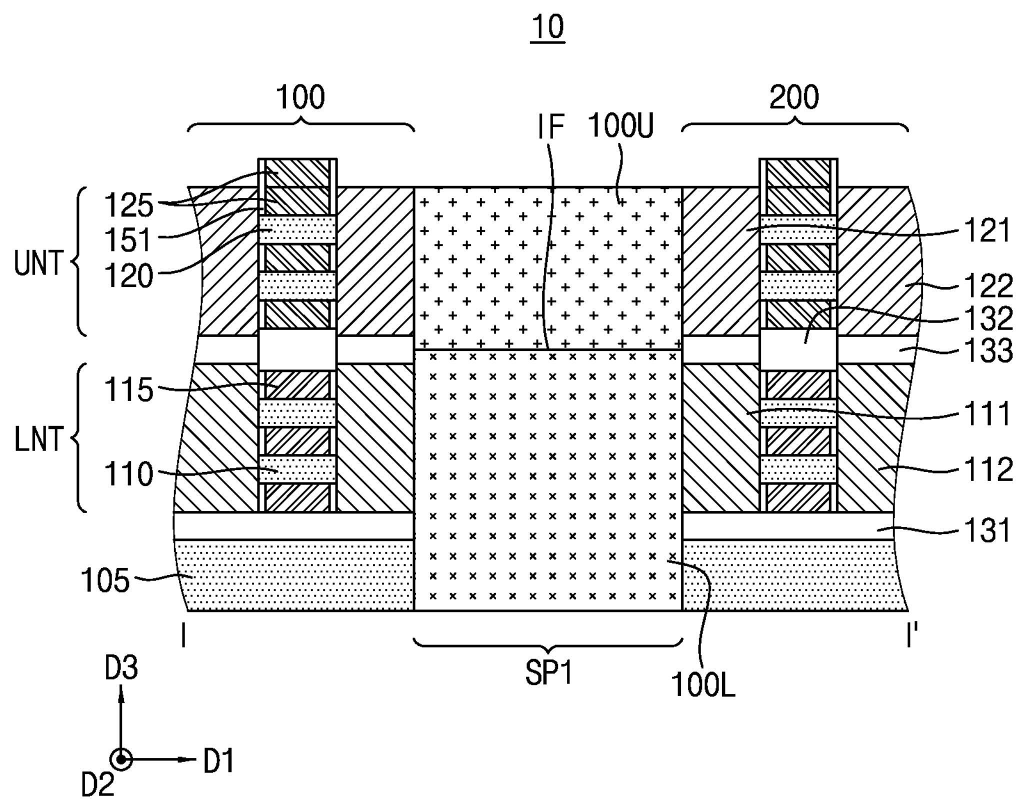
FIG. 1B illustrates a cross-sectional view of the multi-stack semiconductor device shown in FIG. 1A taken along a line I-I' therein, according to an embodiment.

FIG. 1A illustrates a top plan view of a multi-stack semiconductor device including a plurality of multi-stack nanosheet transistors and a double diffusion break (DDB) structure, according to an embodiment. FIG. 1B illustrates a cross-sectional view of the multi-stack semiconductor device shown in FIG. 1A taken along a line I-I' therein, according to an embodiment.

Referring to FIGS. 1A and 1B, a multi-stack semiconductor device 10 shown therein includes a 1$^{st}$ multi-stack nanosheet transistor 100, a 2$^{nd}$ multi-stack nanosheet transistor 200, and a DDB structure isolating the two multi-stack nanosheet transistors 100 and 200, according to an embodiment. The multi-stack semiconductor device 10 is formed above a substrate 105 across a plurality of gate pitches similar to the semiconductor device array 12 shown in FIG. 12.

Herebelow, when a diffusion break structure such as a DDB structure and a single diffusion break (SDB) structure is vertically divided by a lower portion and an upper portion, they are referred to as a lower diffusion break structure and an upper diffusion break structure, respectively.

Although FIGS. 1A and 1B show only the two multi-stack nanosheet transistors 100 and 200, one or more multi-stack nanosheet transistors may be arranged on the left of the 1$^{st}$ multi-stack nanosheet transistor 100 and the right of the 2$^{nd}$ multi-stack nanosheet transistor 200 in a D1 direction, and also, additional one or more multi-stack nanosheet transistors may be arranged above and below the 1$^{st}$ multi-stack nanosheet transistor 100 and the 2$^{nd}$ multi-stack nanosheet transistor 200 in a D2 direction perpendicular to the D1 direction. Thus, the multi-stack semiconductor device 10 may take a form of an array of a plurality of multi-stack nanosheet transistors in the D1 direction, the D2 direction, or both the D1 direction and the D2 direction.

Each of the two multi-stack nanosheet transistors 100 and 200 includes a lower nanosheet transistor LNT and an upper nanosheet transistor UNT formed above a substrate 105 in this order in a D3 direction perpendicular to the D1 direction and the D2 direction. A 1st isolation layer 131 may be formed between the substrate 105 and the lower nanosheet transistor LNT for isolation thereof.

The lower nanosheet transistor LNT includes a plurality of lower nanosheet layers 110 as channel for current flow in the lower nanosheet transistor LNT, and the upper nanosheet transistor UNT includes a plurality of upper nanosheet layers 120 as channel for current flow in the upper nanosheet transistor UNT. Both of the lower nanosheet layers 110 and the upper nanosheet layers 120 may be grown by epitaxy from the substrate 105 formed of, for example, silicon (Si).

The lower nanosheet layers 110 and the upper nanosheet layers 120 are completely surrounded by a lower gate structure 115 and an upper gate structure 125, respectively, except at their end portions in a channel length direction, i.e., the D2 direction. These end portions may be exposed from two opposite sides of the lower gate structure 115 and the upper gate structure 125, respectively. At the end portions of the lower nanosheet layers 110, lower source/drain regions 111/112 are formed, respectively, and at the end portion of the upper nanosheet layers 120, upper source/drain regions 121/122 are formed, respectively. A 2$^{nd}$ isolation layer 132 may be formed between the lower gate structure 115 and the upper gate structure 125 for isolation thereof, and a 3$^{rd}$ isolation layer 133 may be formed between the lower source/drain regions 111/112 and the upper source/drain regions 121/122 for isolation thereof. Further, a spacer layer 151 may be formed on two opposite surfaces of the lower gate structure 115, where the lower source/drain regions 111/112 are formed, and two opposite surfaces of the upper gate structure 125 where the upper source/drain regions 121/122 are formed. The spacer layer 151 isolates the lower gate structure 115 and the upper gate structure 125 from the lower source/drain regions 111/112 and the upper source/drain regions 121/122, respectively.

According to an embodiment, each of the lower nanosheet transistors LNT may be one of a p-type transistor and an n-type transistor, and each of the upper nanosheet transistor UNT may be the other of the p-type transistor and the n-type transistor. Here, the p-type transistor may be a p-type FET (PFET) or a p-type metal oxide semiconductor (PMOS) transistor, and the n-type transistor may be an n-type FET (NFET) or an n-type metal oxide semiconductor (NMOS) transistor, not being limited thereto, according to an embodiment. Herebelow, the descriptions of embodiments are provided for a case in which the p-type transistor is a PFET, and the n-type transistor is an NFET. Thus, the lower gate structure 115 and the lower source/drain regions 111/112 forming the lower nanosheet transistor LNT may be formed of materials different from those of the upper gate structure 125 and the upper source/drain regions 121/122 forming the upper nanosheet transistors UNT.

As noted above, the two multi-stack nanosheet transistors 100 and 200 are isolated from each other by a DDB structure which includes a lower DDB structure 100L and an upper DDB structure 100U. The lower DDB structure 100L may isolate the lower nanosheet transistor LNT of the 1$^{st}$ multi-stack nanosheet transistor 100 from the lower nanosheet transistor LNT of the 2$^{nd}$ multi-stack nanosheet transistor 200. The upper DDB structure 100U may isolate the upper nanosheet transistor UNT of the 1$^{st}$ multi-stack nanosheet transistor 100 from the upper nanosheet transistor UNT of the 2$^{nd}$ multi-stack nanosheet transistor 200.

Here, it is noted that a drive current performance of the multi-stack semiconductor device 10 may be enhanced by effectively controlling stress applied to the lower nanosheet transistors LNT, that is, PFETs, at a lower stack and the upper nanosheet transistors UNT, that is, NFETs, at an upper stack using the lower DDB structure 100L and the upper DDB structure 100U. For this purpose, the lower DDB structure 100L may have a material composition different from that of the upper DDB structure 100U when the lower nanosheet transistors LNT are of a type different from the upper nanosheet transistors UNT. By differentiating the material compositions of the lower DDB structure 100L and the upper DDB structure 100U, more effectively controlled stress may be applied to channel regions and source/drain regions of the lower nanosheet transistors LNT and the upper nanosheet transistors UNT formed at two opposite sides of the lower DDB structure 100L and the upper DDB structure 100U, respectively. According to an embodiment, the lower DDB structure 100L may be formed of a material favorable to compressive stress control of PFETs, such as silicon nitride or a combination of silicon nitride (SiN) and an oxide material including silicon oxide (SiO) or silicon dioxide ($SiO_2$) not being limited thereto. In contrast, the upper DDB structure 100U may be formed of a material favorable to tensile stress control of NFETs, such as tonen silazene (TOSZ) not being limited thereto, according to an embodiment.

According to another embodiment, the lower nanosheet transistor LNT and the upper nanosheet transistor UNT of each of the 1$^{st}$ multi-stack nanosheet transistor 100 and the 2$^{nd}$ multi-stack semiconductor device 200 may be an NFET and a PFET, respectively. In this case, the lower DDB structure 100L may have a material composition favorable to tensile stress control of NFETs, while the upper DDB structure 100U may have a different material composition favorable to compressive stress control of PFETs. For example, the lower DDB structure 100L may be formed of tonen silazene (TOSZ), and the upper DDB structure 100U may be formed of silicon nitride or a combination of silicon nitride (SiN) and an oxide material including silicon oxide (SiO) or silicon dioxide ($SiO_2$).

Figure 12:
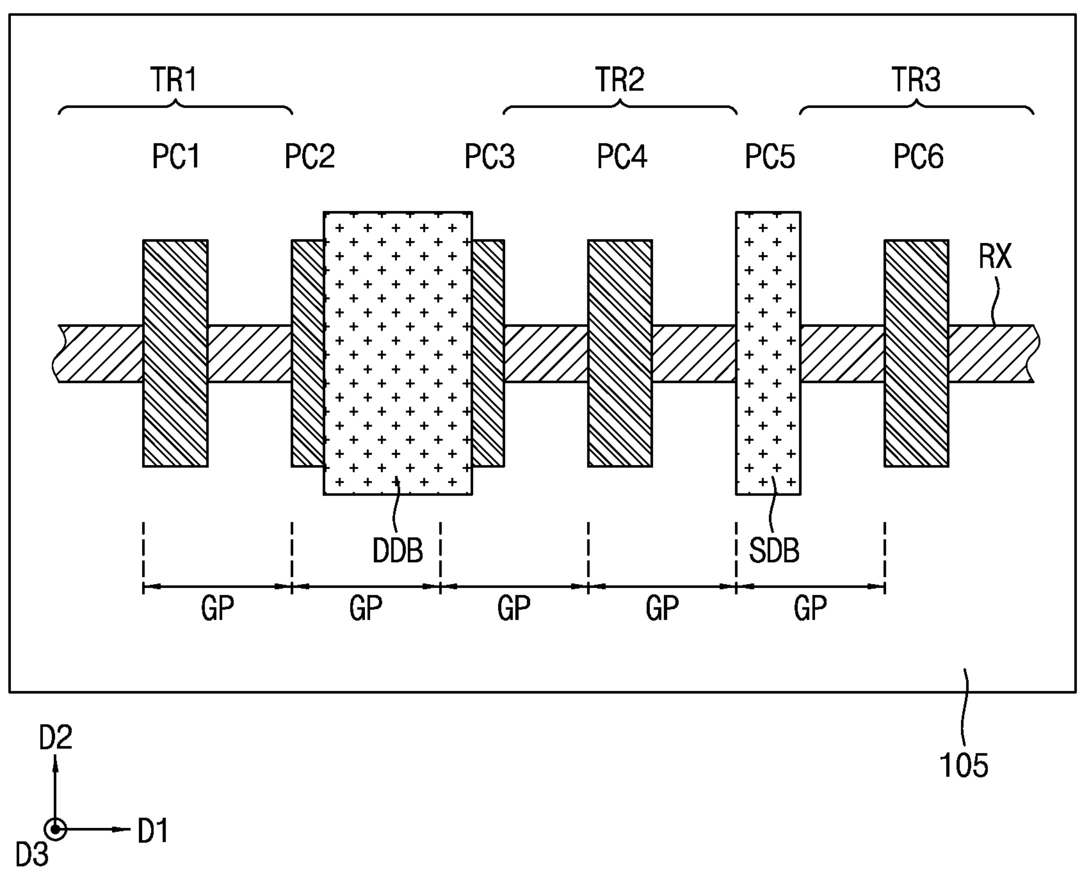
FIG. 12 illustrates a plan view of a related art semiconductor device array including a single diffusion break (SDB) structure and a double diffusion break (DDB) structure.

Meanwhile, the multi-stack semiconductor device 10 is formed above the substrate 105 across a plurality of gate pitches similar to the semiconductor device array 12 shown in FIG. 12. Here, each of the gate pitches corresponds to a horizontal distance between one gate structure or dummy gate structure and an adjacent gate structure or dummy gate structure in the D1 direction.

According to an embodiment, the lower DDB structure 100L and the upper DDB structure 100U may be disposed between the 1$^{st}$ multi-stack nanosheet transistor 100 and the 2$^{nd}$ multi-stack nanosheet transistor 200 to cover a space SP1 corresponding to a little over one gate pitch in the D1 direction. For example, the space SP1 may cover one gate pitch and a width of one gate structure or dummy gate structure in the D1 direction, although the gate pitch and the width of the one gate structure are not shown in FIGS. 1A and 1B because the space SP1 is replaced and filled in by the lower DDB structure 100L and the upper DDB structure 100U.

According to an embodiment, the space SP1 for the DDB structure 100L and the upper DDB structure 100U may cover a space where two adjacent sets of various structures are formed or to be formed above the substrate 105. Here, the various structures may include a lower gate structure, lower nanosheet layers surrounded by the lower gate structure, a 2$^{nd}$ isolation layer above the lower gate structure, an upper gate structure thereabove, and upper nanosheet layers surrounded by the upper gate structure. Further, these various structures may correspond to the lower gate structure 115, the lower nanosheet layers 110, the 2$^{nd}$ isolation layer 132, the upper gate structure 125, and the upper nanosheet layers 120 of each of the two multi-stack nanosheet transistors 100 and 200. The space SP1 may also cover a space of an active region, between the above-described two adjacent sets of various structures in the D1 direction, where a lower source/drain region and an upper source/drain region are formed or to be formed. Further, the space SP1 may extend vertically downward from the above-described two adjacent sets of various structures and the active region to cover corresponding portions of the substrate 105 and the 1$^{st}$ isolation layer 131. Here, the space SP1 may cover a substantially entire space for the above-described two adjacent sets of various structures, the active region and the corresponding portions of the substrate 105 and the 1$^{st}$ isolation layer 131. An interface IF or an interface layer between the lower DDB structure 100L and the upper DDB structure 100U may be formed at a level of a centerline of the 2$^{nd}$ isolation layer 132 and the 3$^{rd}$ isolation layer 133 in the D1 direction.

According to an embodiment, the lower DDB structure 100L and the upper DDB structure 100U may be formed at the space SP1 after lower gate structures, upper gate structures thereabove and 2$^{nd}$ isolation layers therebetween including the lower gate structure 115, the upper gate structure 125 and the 2$^{nd}$ isolation layer 132 of each of the two multi-stack nanosheet transistors 100 and 200, are formed above the substrate 105. In this embodiment, the above-described two adjacent sets of various structures and the corresponding portions of the substrate 105 and the 1$^{st}$ isolation layer 131 may be removed by, for example, dry etching and/or wet etching, to provide the space SP1 for the lower DDB structure 100L and the upper DDB structure 100U.

According to another embodiment, the lower DDB structure 100L and the upper DDB structure 100U may be formed at the space SP1 after lower dummy gate structures, lower sacrificial layers, lower nanosheet layers therebetween, $2^{nd}$ isolation layers, upper dummy gate structures, upper sacrificial layers and upper nanosheet layers, are formed above the substrate 105, and before the lower dummy gate structures, the lower sacrificial layers, the upper dummy gate structures and the upper sacrificial layers are replaced by the lower gate structures and the upper gate structures thereabove including the lower gate structure 115 and the upper gate structure 125 of each of the two multi-stack nanosheet transistors 100 and 200. In this embodiment, the space SP1 may be provided by removing two adjacent sets of a lower dummy gate structure, lower sacrificial layers, lower nanosheet layers therebetween, a $2^{nd}$ isolation layer, an upper dummy gate structure, upper sacrificial layers, and upper nanosheet layers therebetween, an active region between these two adjacent sets of various structures, and corresponding portions of the substrate 105 and the $1^{st}$ isolation layer 131 vertically below the two adjacent sets of various structures and the active region.

The above-described structures and physical dimensions of the lower DDB structure 100L and the upper DDB structure 100U do not limit the inventive concept. According to an embodiment, the lower DDB structure 100L and the upper DDB structure 100U may be formed to occupy a space smaller than the space SP1 shown in FIGS. 1A and 1B of the previous embodiment, as described below.

Figure 2A:
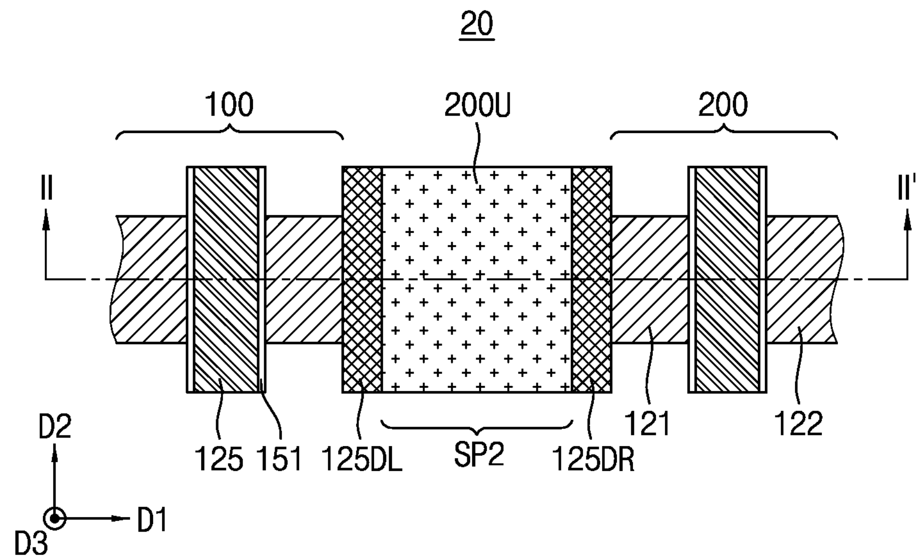
FIG. 2A illustrates a top plan view of another multi-stack semiconductor device including a plurality of multi-stack nanosheet transistors and a DDB structure, according to an embodiment.
Figure 2B:
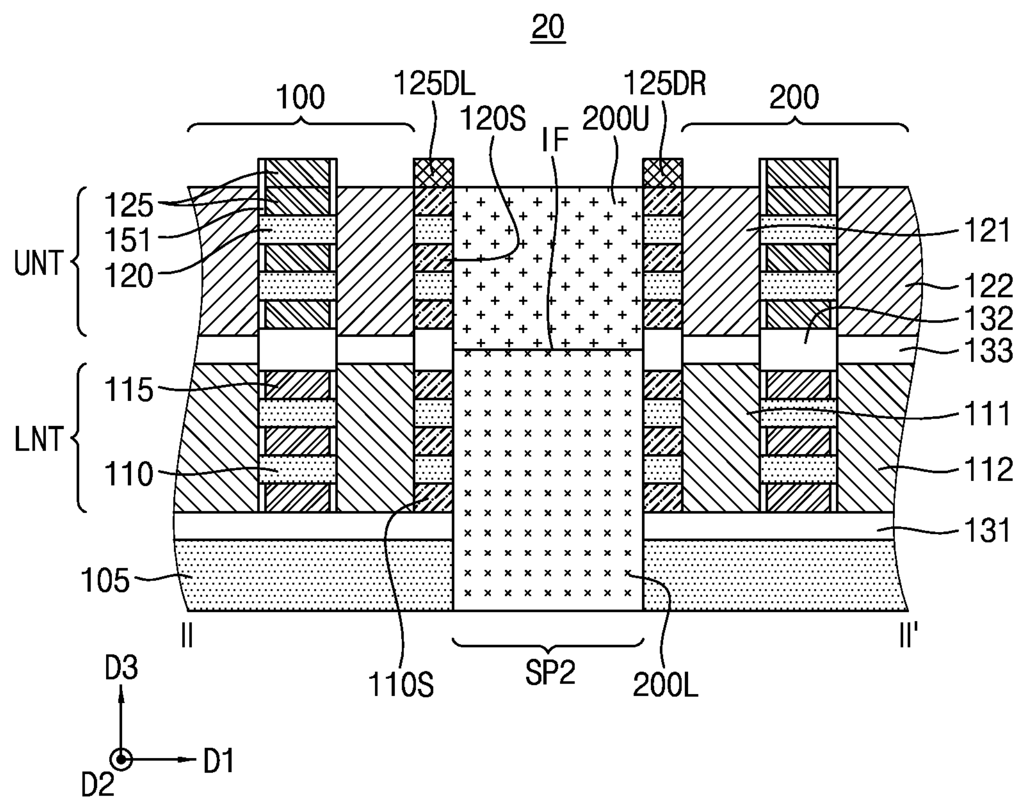
FIG. 2B illustrates a cross-sectional view of the multi-stack semiconductor devices shown in FIG. 2A taken along a line II-II' therein, according to an embodiment.

FIG. 2A illustrates a top plan view of another multi-stack semiconductor device including a plurality of multi-stack nanosheet transistors and a DDB structure, according to an embodiment. FIG. 2B illustrates a cross-sectional view of the multi-stack semiconductor devices shown in FIG. 2A taken along a line II-II' therein, according to an embodiment.

Referring to FIGS. 2A and 2B, a multi-stack semiconductor device 20 shown therein may have the same or similar structures as those of the of multi-stack semiconductor device 10 shown in FIGS. 1A and 1B except some structures including a lower DDB structure 200L and an upper DDB structure 200U. Thus, duplicate descriptions may be omitted herein, and instead, different aspects of embodiments are described herebelow.

According to an embodiment, the lower DDB structure 200L and the upper DDB structure 200U are disposed between the $1^{st}$ multi-stack nanosheet transistor 100 and the $2^{nd}$ multi-stack nanosheet transistor 200 to cover a space SP2 corresponding to approximately one gate pitch in the D1 direction, although the gate pitch is not shown in FIGS. 1A and 1B because the space SP1 is replaced and filled in by the lower DDB structure 200L and the upper DDB structure 200U.

According to an embodiment, the space SP2 for the lower DDB structure 200L and the upper DDB structure 200U may cover a space of a portion, e.g., a right-half, of a left set of a lower dummy gate structure, lower sacrificial layers 110S, lower nanosheet layers therebetween, a portion of a $2^{nd}$ isolation layer, an upper dummy gate structure 125DL, upper sacrificial layers 120S, upper nanosheet layers therebetween, and a portion, e.g., a left-half, of a right set of a lower dummy gate structure, lower sacrificial layers 110S, lower nanosheet layers therebetween, a portion of a $2^{nd}$ isolation layer, an upper dummy gate structure 125DL, upper sacrificial layers 120S, upper nanosheet layers therebetween. The space SP2 may also include a space of an active region, between the above-described left and right sets of the various structures in the D1 direction, where a lower source/drain region and an upper source/drain region are formed or to be formed. Further, the space SP2 may extend vertically downward from the above-described left and right sets of various structures and the active region to cover corresponding portions of the substrate 105 and the $1^{st}$ isolation layer 131. However, the other portion, e.g., a left-half, of the above-described left set of various structures, and the other portion, e.g., a right-half, of the right set of various structures may not be included in the space SP2 to remain at the left side and the right side of the lower DDB structure 200L and the upper DDB structure 200U, respectively.

In the present embodiment, the above-described left and right sets of various structures are formed of portions of the lower dummy gate structure, the lower sacrificial layers 110S, the upper dummy gate structure 125DL, and the upper sacrificial layers 120S. In contrast, each of the two multi-stack nanosheet transistors 100 and 200 is formed of the lower gate structure 115 and the upper gate structure 125 replacing the lower dummy gate structure, the lower sacrificial layers 110S, the upper dummy gate structure 125DL, and the upper sacrificial layers 120S. This is because the lower DDB structure 200L and the upper DDB structure 200U are formed at the space SP2 after lower dummy gate structures, lower sacrificial layers, lower nanosheet layers therebetween, $2^{nd}$ isolation layers, upper dummy gate structures, upper sacrificial layers, and upper nanosheet layers are formed above the substrate 105, and before the lower dummy gate structures, the lower sacrificial layers, the upper dummy gate structures and the upper sacrificial layers are replaced by lower gate structures and upper gate structures thereabove including the lower gate structure 115 and the upper gate structure 125 of each of the two multi-stack nanosheet transistors 100 and 200.

Similar to the previous embodiment of FIGS. 1A and 1B, the lower DDB structure 200L and the upper DDB structure 200U may have different material compositions when the lower nanosheet transistor LNT and the upper nanosheet transistor UNT of each of the two multi-stack nanosheet transistors 100 and 200 form different types of FET, that is, a PFET and an NFET, respectively, or vice versa. Again, the lower DDB structure 200L and the upper DDB structure 200U may be formed of different materials that may be respectively favorable to compressive stress control and tensile stress control for a PFET and an NFET, respectively, or vice versa.

Thus, the lower DDB structure 200L may be formed of the same material forming the lower DDB structure 100L and the upper DDB structure 200U may be formed of the same material forming the upper DDB structure 100U, to effectively control compressive stress of the PFETs, that is, the lower nanosheet transistors LNT formed on the left and right side of the lower DDB structure 200L and tensile stress of the NFETs, that is, the upper nanosheet transistors UNT formed on the left and right side of the upper DDB structure 200U, respectively, or vice versa.

Thus far, the inventive concept of effectively controlling compressive stress and tensile stress in a multi-stack semiconductor device has been described using DDB structures formed between two multi-stack nanosheet transistors arranged in the L1 direction. However, the inventive concept may also apply to a multi-stack semiconductor device in which single diffusion break (SDB) structures are formed between the two multi-stack nanosheet transistors arranged in the D1 direction.

Figure 3A:
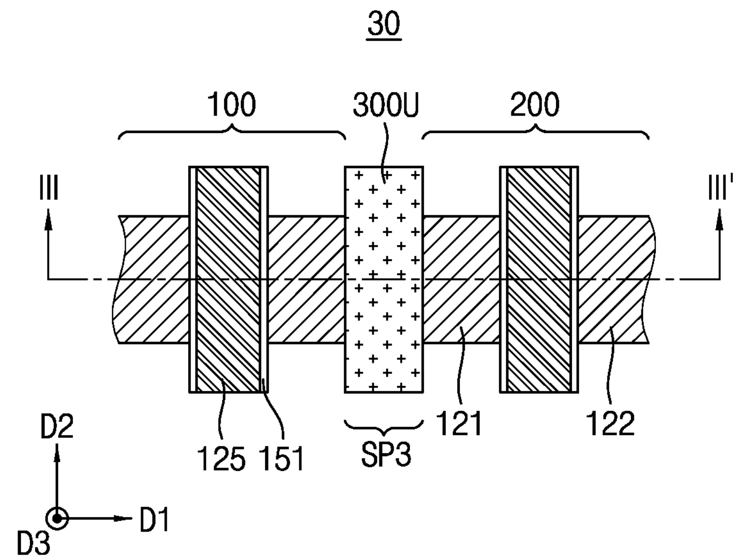
FIG. 3A illustrates a top plan view of a multi-stack semiconductor device including a plurality of multi-stack nanosheet transistors and an SDB structure, according to an embodiment.
Figure 3B:
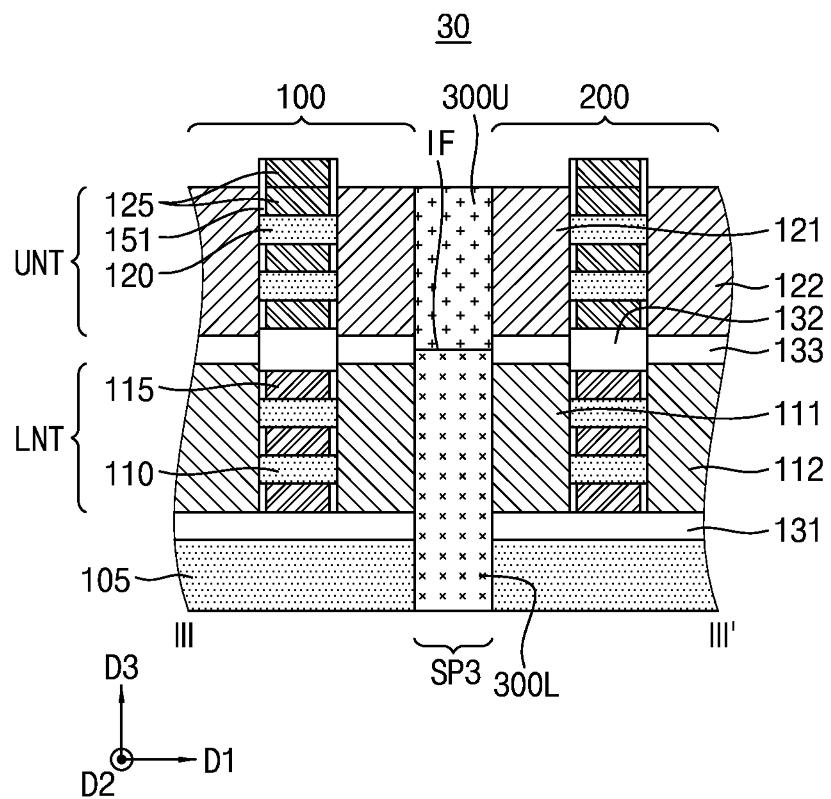
FIG. 3B illustrates a cross-sectional view of the multi-stack semiconductor device shown in FIG. 3A taken along a line III-III' therein, according to an embodiment.

FIG. 3A illustrates a top plan view of a multi-stack semiconductor device including a plurality of multi-stack nanosheet transistors and an SDB structure, according to an embodiment. FIG. 3B illustrates a cross-sectional view of the multi-stack semiconductor device shown in FIG. 3A taken along a line III-III' therein, according to an embodiment.

Referring to FIGS. 3A and 3B, a multi-stack semiconductor device 30 shown therein may have the same or similar structures as those of the of multi-stack semiconductor device 10 shown in FIGS. 1A and 1B except some structures including a lower SDB structure 300L and an upper SDB structure 300U. Thus, duplicate descriptions may be omitted herein, and instead, different aspects of embodiments are described herebelow.

According to an embodiment, the lower SDB structure 300L and the upper SDB structure 300U are positioned between the 1$^{st}$ multi-stack nanosheet transistor 100 and the 2$^{nd}$ multi-stack nanosheet transistor 200 at a space SP3 corresponding to approximately a width of one gate structure or dummy gate structure but less than one gate pitch. For example, the lower SDB structure 300L and the upper SDB structure 300U may occupy one gate structure or dummy gate structure, which are not shown in FIGS. 3A and 3B because the space SP3 is replaced and filled in by the lower SDB structure 300L and the upper SDB structure 300U.

According to an embodiment, the space SP3 for the lower SDB structure 300L and the SDB structure 300U may cover a space where a set of various structures are formed or to be formed above the substrate 105. These various structures may include a lower gate structure, lower nanosheet layers surrounded by the lower gate structure, a 2$^{nd}$ isolation layer above the lower gate structure, an upper gate structure thereabove, and upper nanosheet layers surrounded by the upper gate structure. Further, the space S3 may extend vertically downward from the above-described set of various structures to cover corresponding portions of the substrate 105 and the 1$^{st}$ isolation layer 131. Here, the space SP3 may cover a substantially entire space for the above-described set of various structures and the corresponding portions of the substrate 105 and the 1$^{st}$ isolation layer 131.

Like the lower DDB structure 100L and the upper DDB structure 100U shown in FIGS. 1A and 1B, the lower SDB structure 300L and the upper SDB structure 300U may be formed after the above-described set of various structures is formed, or before the above-described set of various structures replaces a corresponding set of a lower dummy gate structure, lower sacrificial layers, lower nanosheet layers therebetween, the 2$^{nd}$ isolation layer, an upper dummy gate structure, upper sacrificial layers, and upper nanosheet layers is formed. In this case, the space SP3 may cover a space of the above-described corresponding set of various structures and corresponding portions of the substrate 105 and the 1$^{st}$ isolation layer 131 vertically therebelow.

In addition, like the DDB structure 100L and the upper DDB structure 100U shown in FIGS. 1A and 1B, the lower SDB structure 300L and the upper SDB structure 300U may have different material compositions when the lower nanosheet transistor LNT and the upper nanosheet transistor UNT of each of the two multi-stack nanosheet transistors 100 and 200 form different types of FET, that is, a PFET and an NFET, respectively, or vice versa. Again, the lower SDB structure 300L and the upper SDB structure 300U may be formed of different materials that may be favorable to compressive stress control and tensile stress control for a PFET and an NFET, respectively, or vice versa. Thus, the lower SDB structure 300L and the upper DDB structure 300U may be able to more effectively control compressive stress of the PFETs, that is, the lower nanosheet transistors LNT formed on the left and right side of the lower SDB structure 300L, and tensile stress of the NFETs, that is, the upper nanosheet transistors UNT formed on the left and right side of the upper SDB structure 300U, respectively, or vice versa.

As noted above, the SDB structures may be formed in an array of multi-stack nanosheet transistors to achieve a device density gain compared to the DDB structures that have a higher device isolation performance.

According to the above embodiments, the multi-stack nanosheet transistors 100 and 200 formed of a lower nanosheet transistor LNT, which is one of a PFET and an NFET, and an upper nanosheet transistor UNT, which is the other of the PFET and the NFET, may be stress-controlled by forming a lower diffusion break structure and an upper diffusion break structure with different materials. However, the inventive concept is not limited thereto. According to an embodiment, the stress of the multi-stack nanosheet transistors may be controlled by forming the lower diffusion break structure and the upper diffusion break structure in different physical dimensions, as described below.

Figure 4A:
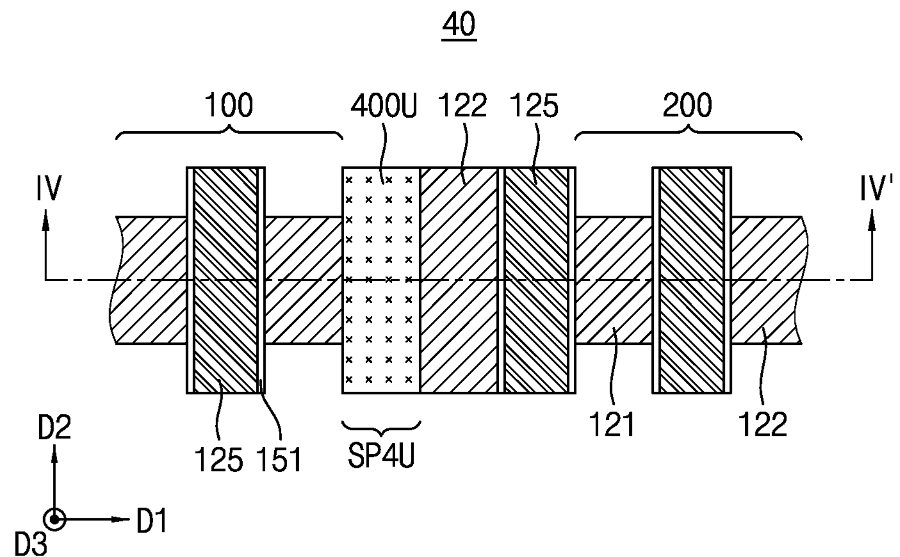
FIG. 4A illustrates a top plan view of a multi-stack semiconductor device including a plurality of multi-stack nanosheet transistors and both a DDB structure and an SDB structure, according to an embodiment.
Figure 4B:
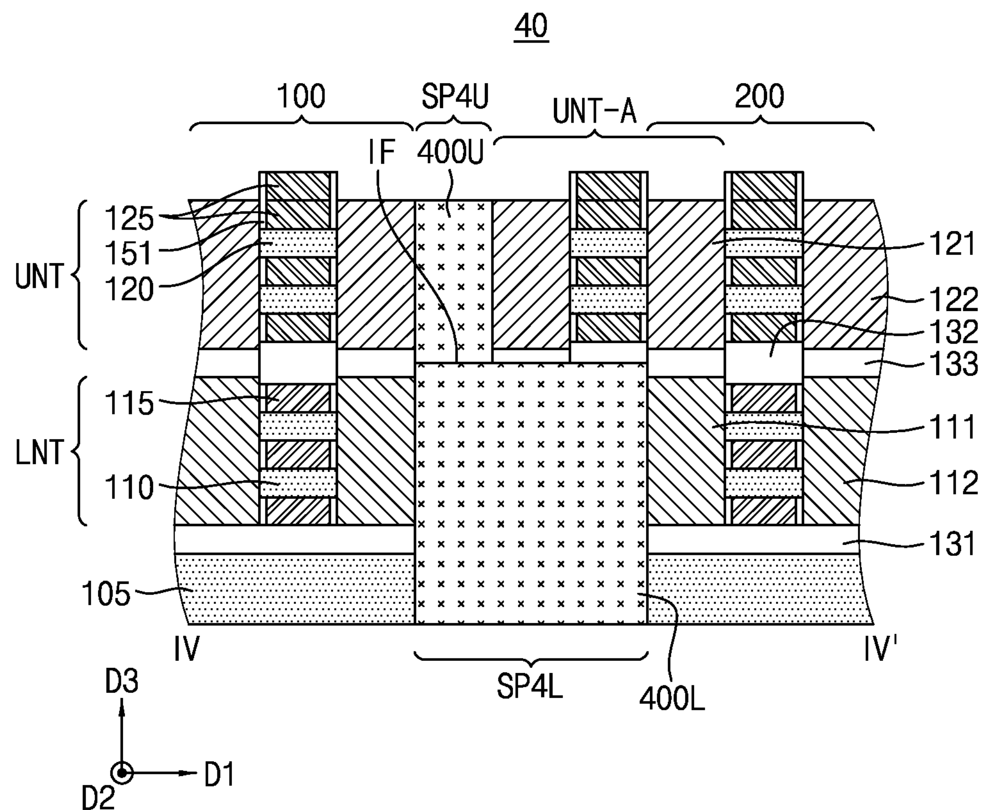
FIG. 4B illustrates a cross-sectional view of the multi-stack semiconductor device shown in FIG. 4A taken along a line IV-IV' therein, according to an embodiment.

FIG. 4A illustrates a top plan view of a multi-stack semiconductor device including a plurality of multi-stack nanosheet transistors and both a DDB structure and an SDB structure, according to an embodiment. FIG. 4B illustrates a cross-sectional view of the multi-stack semiconductor device shown in FIG. 1A taken along a line IV-IV' therein, according to an embodiment.

Referring to FIGS. 4A and 4B, a multi-stack semiconductor device 40 shown therein may have the same or similar structures as those of the of multi-stack semiconductor device 10 shown in FIGS. 1A and 1B except some structures including a diffusion break structure and an additional upper nanosheet transistor UNT. Thus, duplicate descriptions may be omitted herein, and instead, different aspects of embodiments are described herebelow.

According to an embodiment, the multi-stack semiconductor device 40 includes an additional upper nanosheet transistor UNT-A in addition to the two multi-stack nanosheet transistors 100 and 200. The additional upper nanosheet transistor UNT-A may share one of the upper source/drain regions 121 with the upper nanosheet transistor UNT of the 2$^{nd}$ multi-stack nanosheet transistor 200. Moreover, the lower nanosheet transistors LNT of the two multi-stack nanosheet transistors 100 and 200 are isolated from each other by a DDB structure 400L, while the upper nanosheet transistor UNT of the 1$^{st}$ multi-stack nanosheet transistor 100 and the additional upper nanosheet transistor UNT-A are isolated from each other by an SDB structure 400U formed right above the DDB structure 400L. Thus, a gate structure and a source/drain region of the additional upper nanosheet transistor UNT-A may vertically overlap the DDB400L structure.

Although the DDB structure 400L and the SDB structure 400U have different physical dimensions as described above, the two diffusion break structures may have the same material composition, according to the present embodiment. When both the DDB structure 400L and the SDB structure 400U are formed of a material composition favorable to compressive stress control such as SiN or a combination of SiN and an oxide material including SiO or $SiO_2$, the lower nanosheet transistors LNT of the two multi-stack nanosheet transistors 100 and 200 isolated from each other by the DDB structure 400L may form PFETs, while the upper nanosheet transistor UNT of the 1$^{st}$ multi-stack nanosheet transistor 100 and the additional upper nanosheet transistor UNT-A isolated from each other by the SDB structure 400U form NFETs. In contrast, when both the DDB structure 400L and the SDB structure 400U have a material composition favorable to tensile stress control such as TOSZ, the lower nanosheet transistors LNT of the two multi-stack nanosheet transistors 100 and 200 isolated from each other by the DDB structure 400L may form NFETs, while the upper nanosheet transistor UNT of the 1$^{st}$ multi-stack nanosheet transistor 100 and the additional upper nanosheet transistor UNT-A isolated from each other by the SDB structure 400U form PFETs. This is because, when a DDB structure and an SDB structure are formed of a same material, the DDB structure having a more amount of a stress control material may have a better stress control performance than the SDB structure.

In the present embodiment, the DDB structure 400L occupies a space SP4L which is the same as the space occupied by the lower DDB structure 100L shown in FIG. 1B, and the SDB structure 400U occupies a space SP4U is the same as the space occupied the upper SDB structure 300U shown in FIG. 3B. However, the DDB structure 400L and the SDB structure 400U formed of the same material and a process forming thereof are not limited to the present embodiments. According to an embodiment, the DDB structure 400L may be formed to occupy a space smaller than the space SP4L shown in FIG. 4B of the previous embodiment, as described below.

Figure 5A:
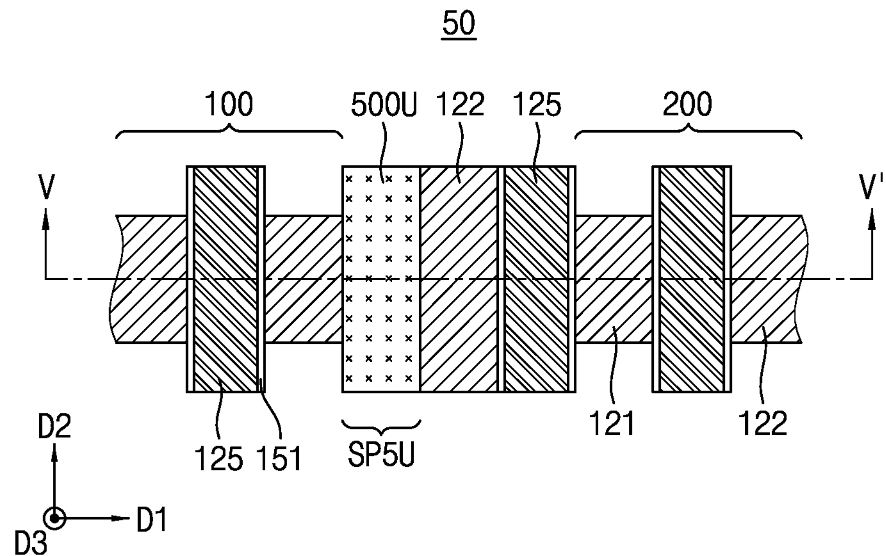
FIG. 5A illustrates a top plan view of another multi-stack semiconductor device including a plurality of multi-stack nanosheet transistors and both a DDB structure and an SDV structure, according to an embodiment.
Figure 5B:
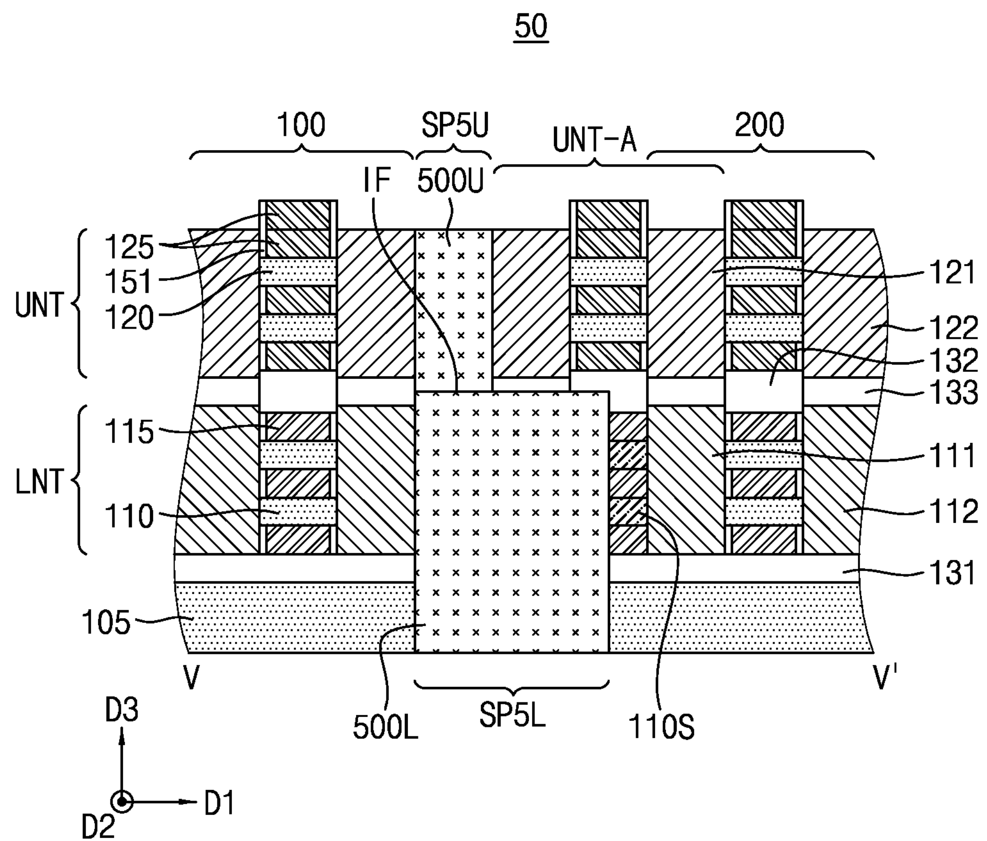
FIG. 5B illustrates a cross-sectional view of the multi-stack semiconductor devices shown in FIG. 5A taken along a line V-V' therein, according to an embodiment.

FIG. 5A illustrates a top plan view of another multi-stack semiconductor device including a plurality of multi-stack nanosheet transistors and both a DDB structure and an SDV structure, according to an embodiment. FIG. 5B illustrates a cross-sectional view of the multi-stack semiconductor devices shown in FIG. 5A taken along a line V-V' therein, according to an embodiment.

Referring to FIGS. 5A and 5B, a multi-stack semiconductor device 50 shown therein may have the same or similar structures as those of the of multi-stack semiconductor device 40 shown in FIGS. 4A and 4B except some structures including a DDB structure 500L. Thus, duplicate descriptions may be omitted herein, and instead, different aspects of embodiments are described herebelow.

According to an embodiment, the DDB structure 500L are disposed between the lower nanosheet transistor LNT of the 1$^{st}$ multi-stack nanosheet transistor 100 and the lower nanosheet transistor LNT of the 2$^{nd}$ multi-stack nanosheet transistor 200 at a space SP5L as shown in FIGS. 5A and 5B. The space SP5L may cover a little over one gate pitch in the D1 direction, although the gate pitch is not shown in FIGS. 5A and 5B because the space SP5L is replaced and filled in by the DDB structure 500L.

According to an embodiment, the space SP5L for the DDB structure 500L may cover a space of a left set of a lower dummy gate structure, lower sacrificial layers, lower nanosheet layers therebetween and a portion of a 2$^{nd}$ isolation layer, and a portion, e.g., a left-half, of a right set of a lower dummy gate structure, lower sacrificial layers 110S, the lower nanosheet layers 110 therebetween and a portion of the 2$^{nd}$ isolation layer 132 in the D1 direction. The space SP5L may also include a space of a portion of a 3$^{rd}$ isolation layer and an active region, between the above-described left and right sets of the various structures in the D1 direction, where a lower source/drain region is formed or to be formed. Further, the space SP5L may extend vertically downward from the above-described left set of various structures and left-half of the right set of various structures and the active region to cover corresponding portions of the substrate 105 and the 1$^{st}$ isolation layer 131. However, the other portion, e.g., a right-half, of the right set of the lower dummy gate structure, the lower sacrificial layers 110S, the lower nanosheet layers 110 therebetween and the 2$^{nd}$ isolation layer 132 may not be included in the space SP5L to remain at the right side of the DDB structure 500L.

In the present embodiment, an SDB structure 500U isolating the upper nanosheet transistor UNT of the 1$^{st}$ multi-stack nanosheet transistor 100 and the additional upper nanosheet transistor UNT-A of the 2$^{nd}$ multi-stack nanosheet transistor 200 may occupy a space SP5U which may be the same as the space SP4U as shown in FIGS. 4A and 4B.

However, it is noted that the DDB structure 500L may still include a more amount of stress control material than the SDB structure 500U, and thus, the lower nanosheet transistors LNT and the upper nanosheet transistors UNT of the multi-stack semiconductor device 50 may be stress-controlled in a manner similar to those of the multi-stack semiconductor device 40 in the previous embodiment.

In the embodiments of FIGS. 4A, 4B, 5A and 5B, a DDB structure is formed to isolate two adjacent lower nanosheet transistors LNT, and an SDB structure is formed right above the DDB structure to isolate two adjacent upper nanosheet transistors UNT and UNT-A. However, the positions of the DDB structure and the SDB structure may be exchanged, according to an embodiment described below.

Figure 6A:
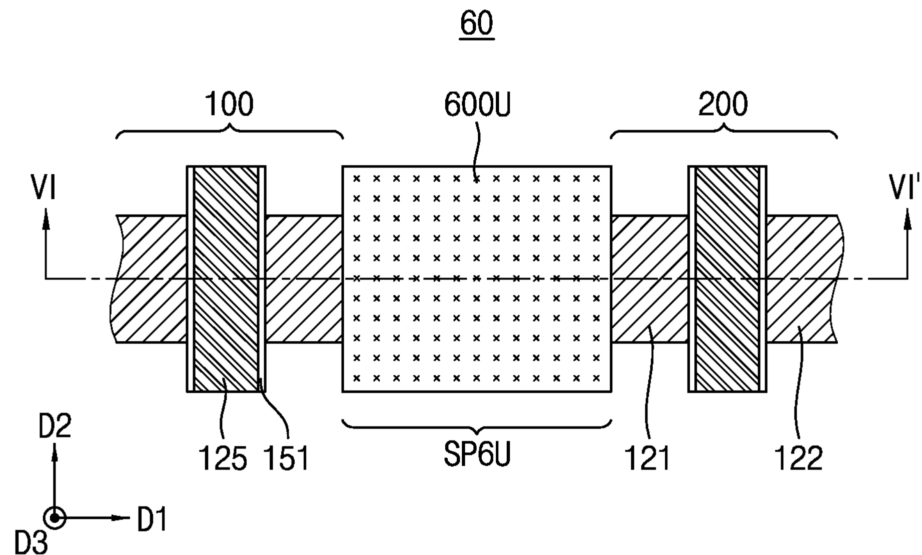
FIG. 6A illustrates a top plan view of still another multi-stack semiconductor device including a plurality of multi-stack nanosheet transistors and both a DDB structure and an SDV structure, according to an embodiment.
Figure 6B:
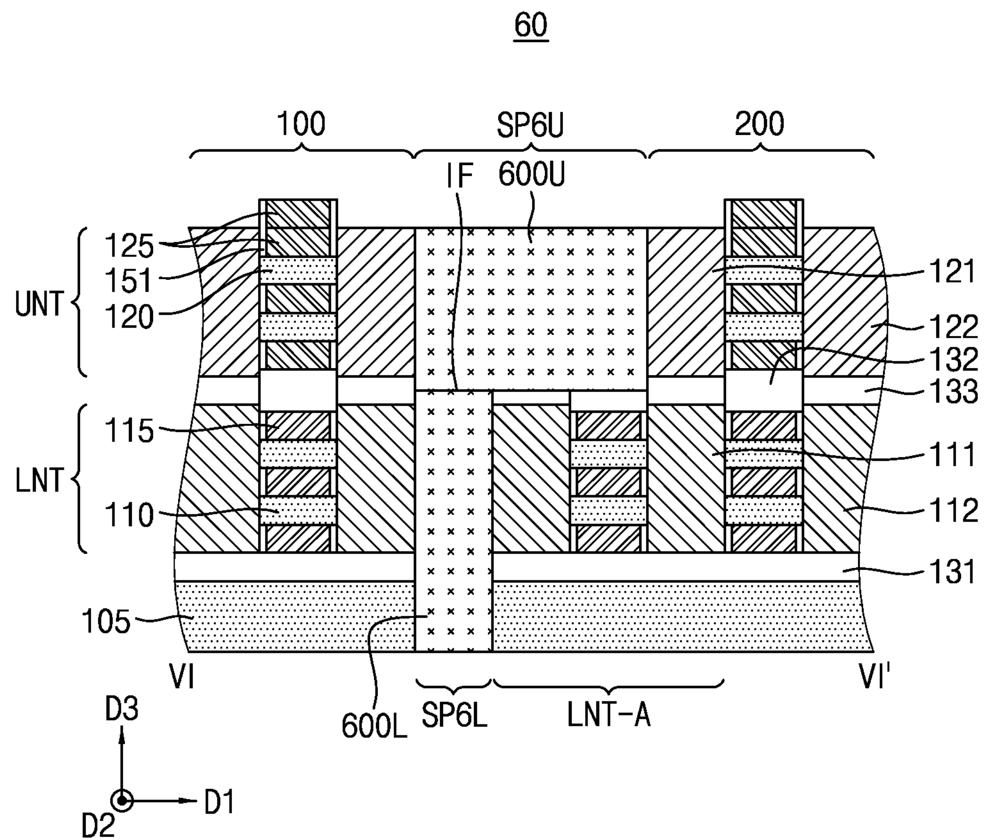
FIG. 6B illustrates a cross-sectional view of the multi-stack semiconductor devices shown in FIG. 5A taken along a line VI-VI' therein, according to an embodiment.

FIG. 6A illustrates a top plan view of still another multi-stack semiconductor device including a plurality of multi-stack nanosheet transistors and both a DDB structure and an SDV structure, according to an embodiment. FIG. 6B illustrates a cross-sectional view of the multi-stack semiconductor devices shown in FIG. 5A taken along a line VI-VI' therein, according to an embodiment.

Referring to FIGS. 6A and 6B, a multi-stack semiconductor device 60 shown therein may have the same or similar structure as those of the of multi-stack semiconductor device 40 shown in FIGS. 4A and 4B except some aspects including positions of an SDB structure and a DDB structure. Thus, duplicate descriptions may be omitted herein, and instead, different aspects of embodiments are described herebelow.

In the present embodiment, an SDB structure 600L is formed to isolate the lower nanosheet transistor LNT of the 1$^{st}$ multi-stack nanosheet transistor 100 and an additional lower nanosheet transistor LNT-A of the 2$^{nd}$ multi-stack nanosheet transistor 200. The SDB structure 600L occupies a space SP6L which is the same as the space occupied by the lower SDB structure 300L shown in FIG. 3B. Further, in the present embodiment, a DDB structure 600U formed above the SDB structure 600L is formed to isolate the upper nanosheet transistors UNT of the 1st multi-stack nanosheet transistor 100 and the multi-stack nanosheet transistor 200. The DDB structure 600U occupies a space SP6U which is the same as the space occupied by the upper DDB structure 100U shown in FIG. 1B. However, the SDB structure 600L and the DDB structure 600U having different physical dimensions and a process forming thereof are not limited to the present embodiments.

According to an embodiment, the DDB structure 600U may be formed to occupy a space smaller than the space SP6U shown in FIG. 6B of the previous embodiment, as described below.

Figure 7A:
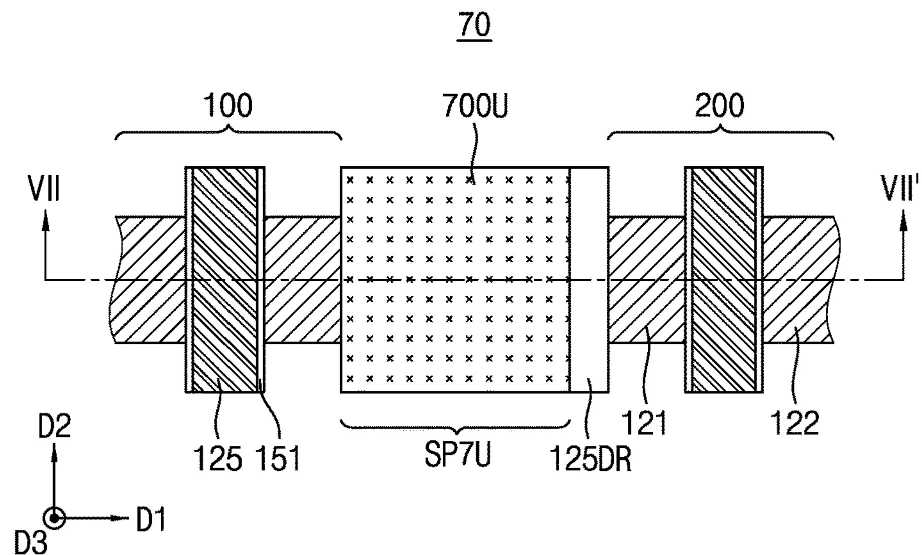
FIG. 7A illustrates a top plan view of yet another multi-stack semiconductor device including a plurality of multi-stack nanosheet transistors and both a DDB structure and an SDV structure, according to an embodiment.
Figure 7B:
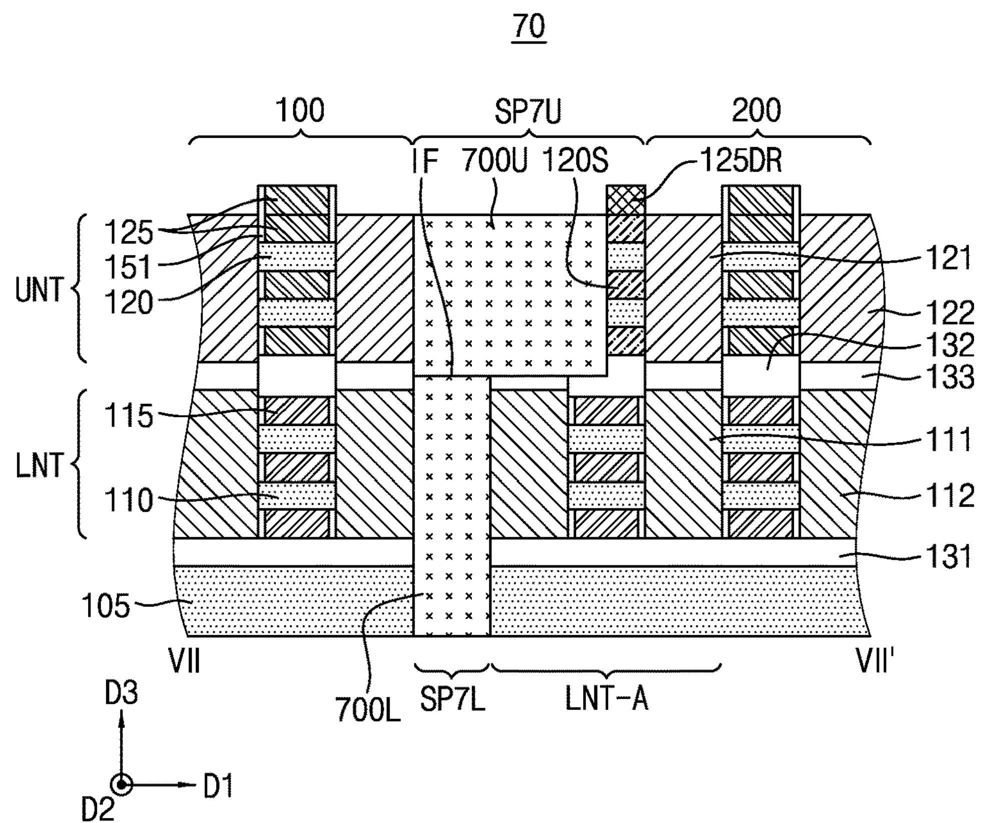
FIG. 7B illustrates a cross-sectional view of the multi-stack semiconductor devices shown in FIG. 7A taken along a line VII-VII' therein, according to an embodiment.

FIG. 7A illustrates a top plan view of yet another multi-stack semiconductor device including a plurality of multi-stack nanosheet transistors and both a DDB structure and an SDV structure, according to an embodiment. FIG. 7B illustrates a cross-sectional view of the multi-stack semiconductor devices shown in FIG. 7A taken along a line VII-VII' therein, according to an embodiment.

Referring to FIGS. 7A and 7B, a multi-stack semiconductor device 70 shown therein may have the same or similar structure as those of the of multi-stack semiconductor device 60 shown in FIGS. 6A and 6B except some structures including a DDB structure 700U. Thus, duplicate descriptions may be omitted herein, and instead, different aspects of embodiments are described herebelow.

According to an embodiment, the DDB structure 700U is disposed between the upper nanosheet transistor UNT of the $1^{st}$ multi-stack nanosheet transistor 100 and the upper nanosheet transistor UNT of the $2^{nd}$ multi-stack nanosheet transistor 200 at a space SP7U as shown in FIGS. 7A and 7B. The space SP7U may cover a little over one gate pitch in the D1 direction, although the gate pitch is not shown in FIGS. 7A and 7B because the space SP7U is replaced and filled in by the DDB structure 700U.

According to an embodiment, the space SP7U for the DDB structure 700U may cover a space of a left set of an upper dummy gate structure, upper sacrificial layers, upper nanosheet layers therebetween and a portion of a $2^{nd}$ isolation layer, and a portion, e.g., a left-half, of a right set of an upper dummy gate structure 125DR, upper sacrificial layers 120S, the upper nanosheet layers 120 therebetween and a portion of a $2^{nd}$ isolation layer 132. The space SP7U may also include a space of a portion of a $3^{rd}$ isolation layer and an active region, between the above-described left and right sets of the various structures in the D1 direction, where an upper source/drain region is formed or to be formed. However, e the other portion, e.g., a right-half, of the right set of the upper dummy gate structure 125DR, the upper sacrificial layers 120S, the upper nanosheet layers 120 therebetween and the other portion of the $2^{nd}$ isolation layer 132 may not be included in the space SP7U to remain at the right side of the DDB structure 700U.

In the present embodiment, an SDB structure 700L may be the same as the SDB structure 600L isolating the lower nanosheet transistor LNT of the $1^{st}$ multi-stack nanosheet transistor 100 and the additional lower nanosheet transistor LNT-A of the $2^{nd}$ multi-stack nanosheet transistor 200, as shown in FIG. 6B.

Thus far, various embodiments have been described when the multi-stack semiconductor device includes nanosheet transistors at both a lower stack and an upper stack. However, the inventive concept is not limited thereto. According to embodiments, the lower diffusion break structures and the upper diffusion break structures formed of different materials or having different physical dimensions as described above in reference to FIGS. 1A and 1B through 7A and 7B may be employed in a multi-stack semiconductor device including finFETs at both a lower stack and an upper stack, or a multi-stack semiconductor device including nanosheet transistors at one of a lower stack and an upper stack, and finFETs at the other of the lower stack and the upper stack. A few example embodiments are provided herebelow.

Figure 8A:
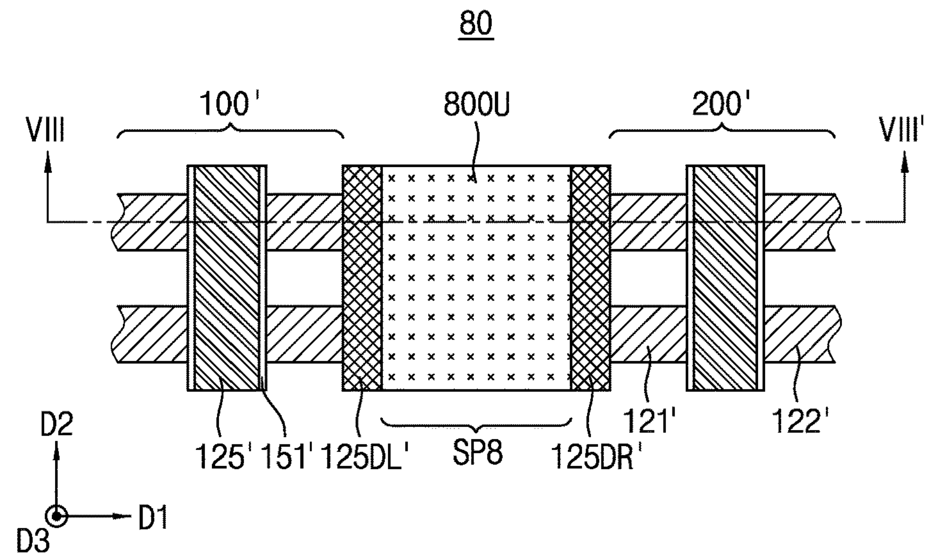
FIG. 8A illustrates a top plan view of a multi-stack semiconductor device including a plurality of multi-stack finFETs and a DDB structure, according to an embodiment.
Figure 8B:
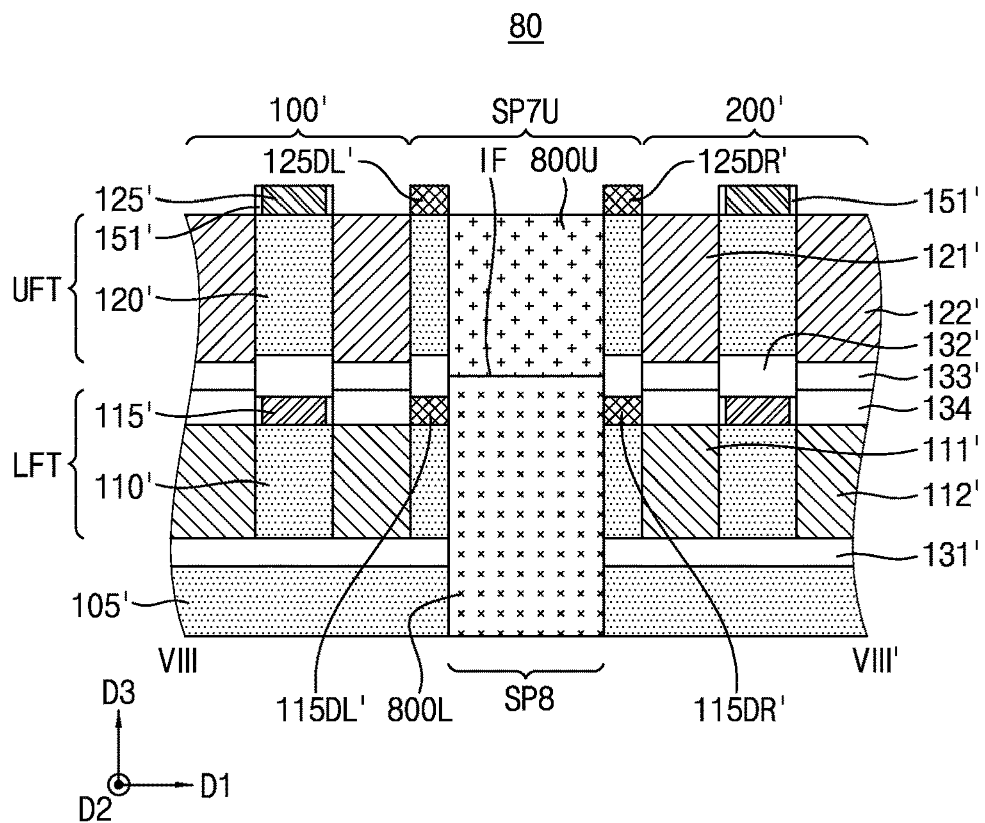
FIG. 8B illustrates a cross-sectional view of the multi-stack semiconductor device shown in FIG. 8A taken along a line VIII-VIII' therein, according to an embodiment.

FIG. 8A illustrates a top plan view of a multi-stack semiconductor device including a plurality of multi-stack finFETs and a DDB structure, according to an embodiment. FIG. 8B illustrates a cross-sectional view of the multi-stack semiconductor device shown in FIG. 8A taken along a line VIII-VIII' therein, according to an embodiment. It is noted that the present embodiment is similar to the previous embodiment described in reference to FIGS. 2A and 2B in terms of the DDB structure.

Referring to FIGS. 8A and 8B, a multi-stack semiconductor device 80 shown therein includes a $1^{st}$ multi-stack finFET 100', a $2^{nd}$ multi-stack finFET 200' and a DDB structure isolating the two multi-stack nanosheet transistors 100' and 200', according to an embodiment. The multi-stack semiconductor device 80 is formed above a substrate 105' across a plurality of gate pitches similar to the semiconductor device array 12 shown in FIG. 12, according to an embodiment.

Although FIGS. 8A and 8B show only the two multi-stack finFETs 100' and 200', one or more multi-stack finFETS may be arranged to the left of the $1^{st}$ multi-stack finFET 100' and the right of the $2^{nd}$ multi-stack finFET 200' in the D1 direction, and also, additional one or more multi-stack finFETs may be arranged above and below the $1^{st}$ multi-stack finFET 100' and the $2^{nd}$ multi-stack finFET 200' in the D2 direction. Thus, the multi-stack semiconductor device 80 may take a form of an array of a plurality of multi-stack finFETs in the D1 direction, D2 direction, or both D1 and D2 directions.

Each of the $1^{st}$ multi-stack finFET 100' and the $2^{nd}$ multi-stack finFET 200' includes a lower finFET LFT and an upper finFET UFT formed above the substrate 105' in this order in the D3 direction. A $1^{st}$ isolation layer 131 may be formed between the substrate 105' and the lower finFET LFT for isolation thereof.

The lower finFET LFT includes a plurality of lower fin structures 110' as channel for current flow in the lower finFET LFT, and the upper finFET UFT includes a plurality of upper fin structures 120' as channel for current flow in the upper finFET UFT. Both of the lower fin structures 110' and the upper nanosheet layers 120' may be grown by epitaxy based on the substrate 105 formed of, for example, Si.

The lower fin structures 110' and the upper fin structures 120' are completely surrounded by a lower gate structure 115' and an upper gate structure 125', respectively, except at their bottom surfaces and end portions in a channel length direction, i.e., the D2 direction. These end portions of the lower fin structures 110' and the upper fin structures 120' may be exposed from two opposite sides of the lower gate structure 115' and the upper gate structure 125', respectively. At the end portions of the lower fin structures 110', lower source/drain regions 111'/112' are formed, respectively, and at the end portion of the upper fin structures 120', upper source/drain regions 121'/122' are formed, respectively. A $2^{nd}$ isolation layer 132' may be formed between the lower gate structure 115' and the upper gate structure 125' for isolation thereof, and a $3^{rd}$ isolation layer 133' may be formed between the lower source/drain regions 111'/112' and the upper source/drain regions 121'/122' for isolation thereof. Further, a spacer layer 151' may be formed on two opposite surfaces of the lower gate structure 115', where the lower source/drain regions 111'/112' are formed, and two opposite surfaces of the upper gate structure 125' where the upper source/drain regions 121'/122' are formed. The spacer layer 151' isolates the lower gate structure 115' and the upper gate structure 125' from the lower source/drain regions 111'/112' and the upper source/drain regions 121'/122', respectively.

According to an embodiment, the $1^{st}$ multi-stack finFET 100' and the $2^{nd}$ multi-stack finFET 200' are isolated from each other by a DDB structure including a lower DDB structure 800L and an upper DDB structure 800U. The lower DDB structure 800L isolates the lower finFET LFT of the $1^{st}$ multi-stack finFET 100' from the lower finFET LFT of the $2^{nd}$ multi-stack finFET 200'. The upper DDB structure 800U isolates the upper finFET UFT of the $1^{st}$ multi-stack finFET 100' from the upper finFET UFT of the $2^{nd}$ multi-stack finFET 200'.

According to an embodiment, each of the lower finFETs LFT may be one of a PFET and an NFET, and each of the upper finFETs UFT may be the other of the PFET and the NFET. Thus, the lower gate structure 115' and the lower source/drain regions 111'/112' forming the lower finFETs LFT may be formed of materials different from those of the upper gate structure 125' and the upper source/drain regions 121'/122' forming the upper finFETs UFT.

It is noted here that the lower DDB structure 800L and the upper DDB structure 800U may have the same structure, and may be formed of the same material as the lower DDB structure 100L and the upper DDB structure 100U shown in FIGS. 1A and 1B. Thus, the lower DDB structure 800L and the upper DDB structure 800U may have a material composition favorable to compressive stress control of PFETs or tensile stress control of NFETs, as described in the previous embodiment in reference to FIGS. 1A and 1B.

According to an embodiment, the lower DDB structure 800L and the upper DDB structure 800U are disposed between the $1^{st}$ multi-stack nanosheet transistor 100' and the $2^{nd}$ multi-stack nanosheet transistor 200' to cover a space SP8 corresponding to approximately one gate pitch in the D1 direction, although the gate pitch is not shown in FIGS. 8A and 8B because the space SP8 is replaced and filled in by the lower DDB structure 800L and the upper DDB structure 800U.

According to an embodiment, the space SP8 for the lower DDB structure 800L and the upper DDB structure 800U may cover a space of a portion, e.g., a right-half, of a left set of a lower dummy gate structure 115DL', lower fin structures 110', a portion of a $2^{nd}$ isolation layer 132', an upper dummy gate structure 125DL', and upper fin structures 120', and a portion, e.g., a left-half, of a right set of a lower dummy gate structure 115DL', lower fin structures 110', a portion of a $2^{nd}$ isolation layer 132', an upper dummy gate structure 125DL', and upper fin structures 120'. The space SP8 may also include a space of an active region, between the above-described left and right sets of the various structures in the D1 direction, where a lower source/drain region and an upper source/drain region are formed or to be formed. Further, the space SP8 may extend vertically downward from the above-described left and right sets of various structures and the active region to cover corresponding portions of the substrate 105' and the $1^{st}$ isolation layer 131'. However, the other portion, e.g., a left-half, of the above-described left set of various structures, and the other portion, e.g., a right-half, of the right set of various structures may not be included in the space SP8 to remain at the left side and the right side of the lower DDB structure 800L and the upper DDB structure 800U, respectively.

Figure 9A:
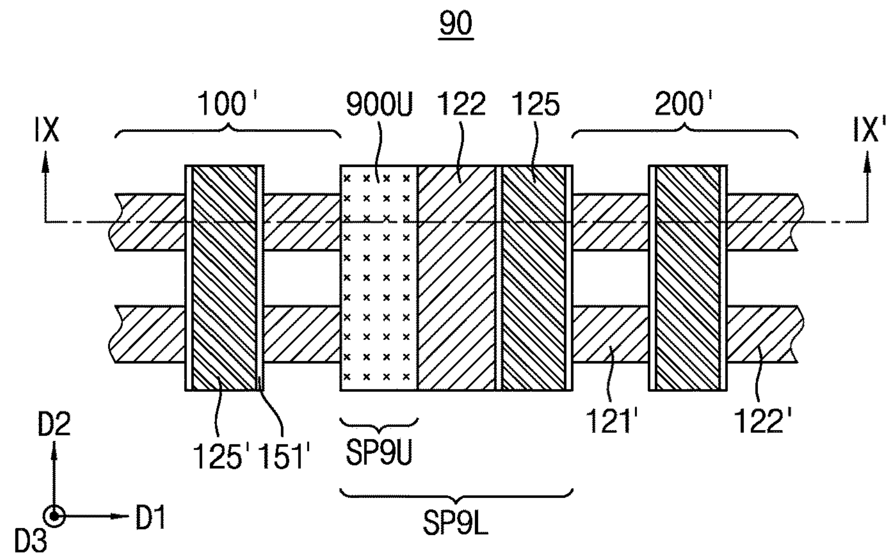
FIG. 9A illustrates a top plan view of a multi-stack semiconductor device including a plurality of multi-stack finFETs and both a DDB structure and an SDV structure, according to an embodiment.
Figure 9B:
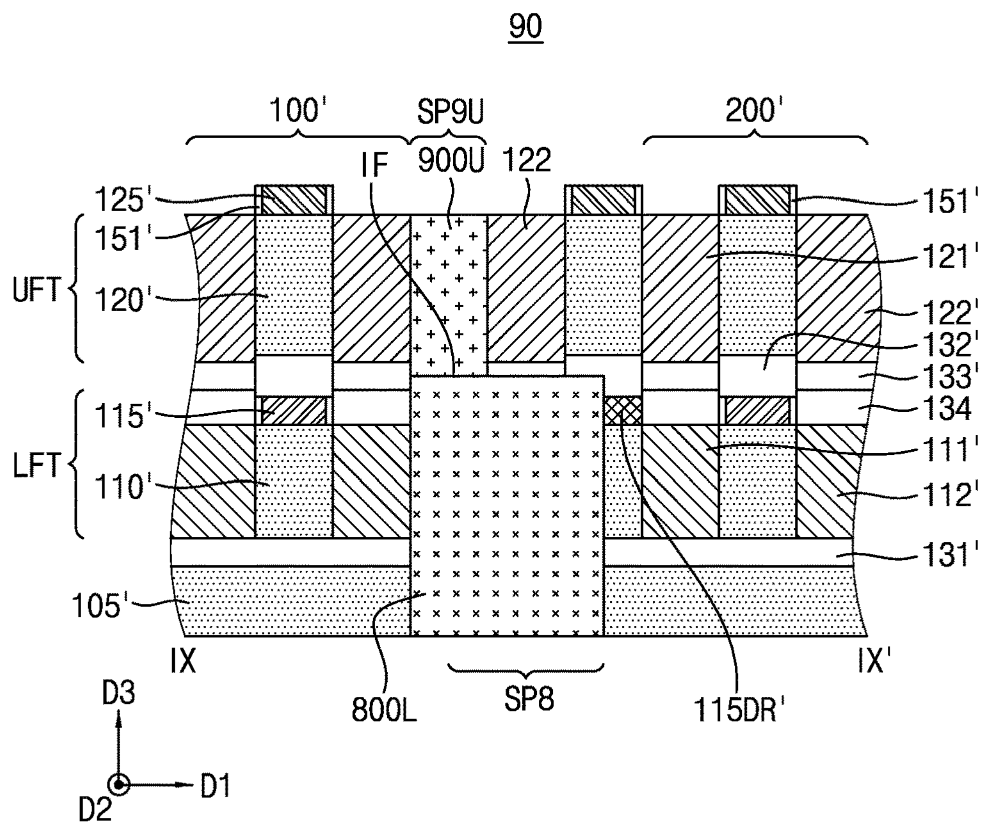
FIG. 9B illustrates a cross-sectional view of the multi-stack semiconductor device shown in FIG. 8A taken along a line IX-IX' therein, according to an embodiment.

FIG. 9A illustrates a top plan view of a multi-stack semiconductor device including a plurality of multi-stack finFETs and both a DDB structure and an SDV structure, according to an embodiment. FIG. 9B illustrates a cross-sectional view of the multi-stack semiconductor device shown in FIG. 8A taken along a line IX-IX' therein, according to an embodiment. It is noted that the present embodiment is similar to the previous embodiment described in reference to FIGS. 5A and 5B in terms of the DDB structure and the SDB structure.

Referring to FIGS. 9A and 9B, a multi-stack semiconductor device 90 shown therein may have the same or similar structure as those of the of multi-stack semiconductor device 80 shown in FIGS. 8A and 8B except some structures including a diffusion break structure and an additional upper finFET UFT-A. Thus, duplicate descriptions may be omitted herein, and instead, different aspects of embodiments are described herebelow.

According to the present embodiment, the multi-stack semiconductor device 90 includes an additional upper finFET UFT-A in addition to the $1^{st}$ multi-stack finFET 100' and the $2^{nd}$ multi-stack finFET 200'. The additional upper finFET UFT-A may share one of the upper source/drain regions 121' with the upper finFET UFT of the $2^{nd}$ multi-stack finFET 200'. Moreover, the lower finFET LFT of the $1^{st}$ multi-stack finFET 100' and the $2^{nd}$ multi-stack finFET 200' are isolated from each other by a DDB structure 900L, while the upper finFET UFT of the $1^{st}$ multi-stack finFET 100' and the additional upper nanosheet transistor UNT-A are isolated from each other by an SDB structure 900U formed right above the DDB structure 900L.

However, the DDB structure 900L and the SDB structure 900U may have the same material composition, according to the present embodiment. When both the DDB structure 900L and the SDB structure 900U have material compositions favorable to compressive stress control such as SiN or a combination of SiN and an oxide material including SiO or $SiO_2$, the lower finFET LFTs of the $1^{st}$ multi-stack finFET 100' and the $2^{nd}$ multi-stack finFET 200' isolated from each other by the DDB structure 400L may form PFETs, while the upper finFET UFT of the $1^{st}$ multi-stack finFET 100' and the additional upper finFET UFT-A isolated from each other by the SDB structure 900U may form NFETs. In contrast, when both the DDB structure 900L and the SDB structure 900U have material compositions favorable to tensile stress control such as TOSZ, the lower finFET LFT of the $1^{st}$ multi-stack finFET 100' and the $2^{nd}$ multi-stack finFET 200' isolated from each other by the DDB structure 900L may form NFETs, while the upper finFET UFT of the $1^{st}$ multi-stack finFET 100' and the additional upper finFET UFT-A isolated from each other by the SDB structure 900U may form PFETs. This is because, when a DDB structure and an SDB structure are formed of a same material, the DDB structure having a more amount of a stress control material may have a better stress control performance than the SDB structure.

According to an embodiment, the DDB structure 900L may be disposed between the lower finFET LFT of the $1^{st}$ multi-stack finFET 100' and the lower finFET LFT of the $2^{nd}$ multi-stack finFET 200' at a space SP9L as shown in FIGS. 9A and 9B. The space SP9L may cover a little over one gate pitch in the D1 direction, although the gate pitch is not shown in FIGS. 9A and 9B because the space SP9L is replaced and filled in by the DDB structure 900L.

According to an embodiment, the space SP9L for the DDB structure 900L may cover a space of a left set of a lower dummy gate structure, lower fin structures, a portion of a $2^{nd}$ isolation layer, an upper dummy gate structure, and upper fin structures, and a portion, e.g., a left-half, of a right set of a lower dummy gate structure 115DR', lower fin structures 110', and a portion of a $2^{nd}$ isolation layer 132'. The space SP9L may also cover an active region, between the above-described left and right sets of the various structures in the D1 direction, where a lower source/drain region is formed or to be formed. Further, the space SP9L may extend vertically downward from the above-described left set of various structures and left-half of the right set of various structures and the active region to cover corresponding portions of the substrate 105' and the $1^{st}$ isolation layer 131'. However, the other portion, e.g., a right-half, of the right set of various structures may not be included in the space SP9L to remain at the right side of the DDB structure 500L.

In the present embodiment, the SDB structure 900U isolating the upper finFET UFT of the $1^{st}$ multi-stack finFET 100' and the additional upper finFET UFT-A of the $2^{nd}$ multi-stack finFET 200' may occupy a space SP9U covering a left set of an upper dummy gate structure and a portion of a $2^{nd}$ isolation layer 132 as shown in FIGS. 9A and 9B.

However, it is noted that the DDB structure 900L may still include a more amount of stress control material than the SDB structure 900U, and thus, the lower finFETs LFT and the upper finFETs UFT of the multi-stack semiconductor device 90 may be stress-controlled in a manner similar to those of the multi-stack semiconductor device 90 in the previous embodiment.

Thus far, all embodiments described above includes a lower DDB structure, that is, a lower portion of a diffusion break structure, penetrating a substrate from the top surface to the bottom surface thereof. However, any one of the lower DDB structures described in these embodiments may be penetrate only an upper portion of the substrate according to embodiments.

All embodiments described above also include a DDB structure and/or an SDB formed of different material compositions or having different physical dimensions for different stress control subject to the type of transistors at both sides thereon in a multi-stack semiconductor device. However, it is noted that the materials and physical dimensions of the diffusion break structure that can be employed in the above embodiment to achieve the inventive concept are not limited thereto. For example, a combination of different material compositions and different physical dimensions may be used to control compressive or tensile stress applied to transistors at both sides of the DDB structure and/or the SDB structure in a multi-stack semiconductor device, according to embodiments. Also, for example, the material compositions in the DDB structure and/or the SDB structure may differ not by forming the DDB structure and/or the SDB structure with a different type of material as described above but by changing a density of the same material or materials or both the density and the type of the material or members to control compressive or tensile stress at both sides of the DDB structure and/or the SDB structure in a multi-stack semiconductor device.

In addition, the diffusion break structure described in all of the above embodiments are disposed between two multi-stack transistors both purposes of isolation and stress control of the two multi-stack transistors. However, the inventive concept may also apply when only one multi-stack transistor is disposed at a side of a lower diffusion break structure and an upper diffusion break structure, that is, for the purpose of compressive or tensile stress control on the multi-stack transistor, according to embodiments.

Figure 10:
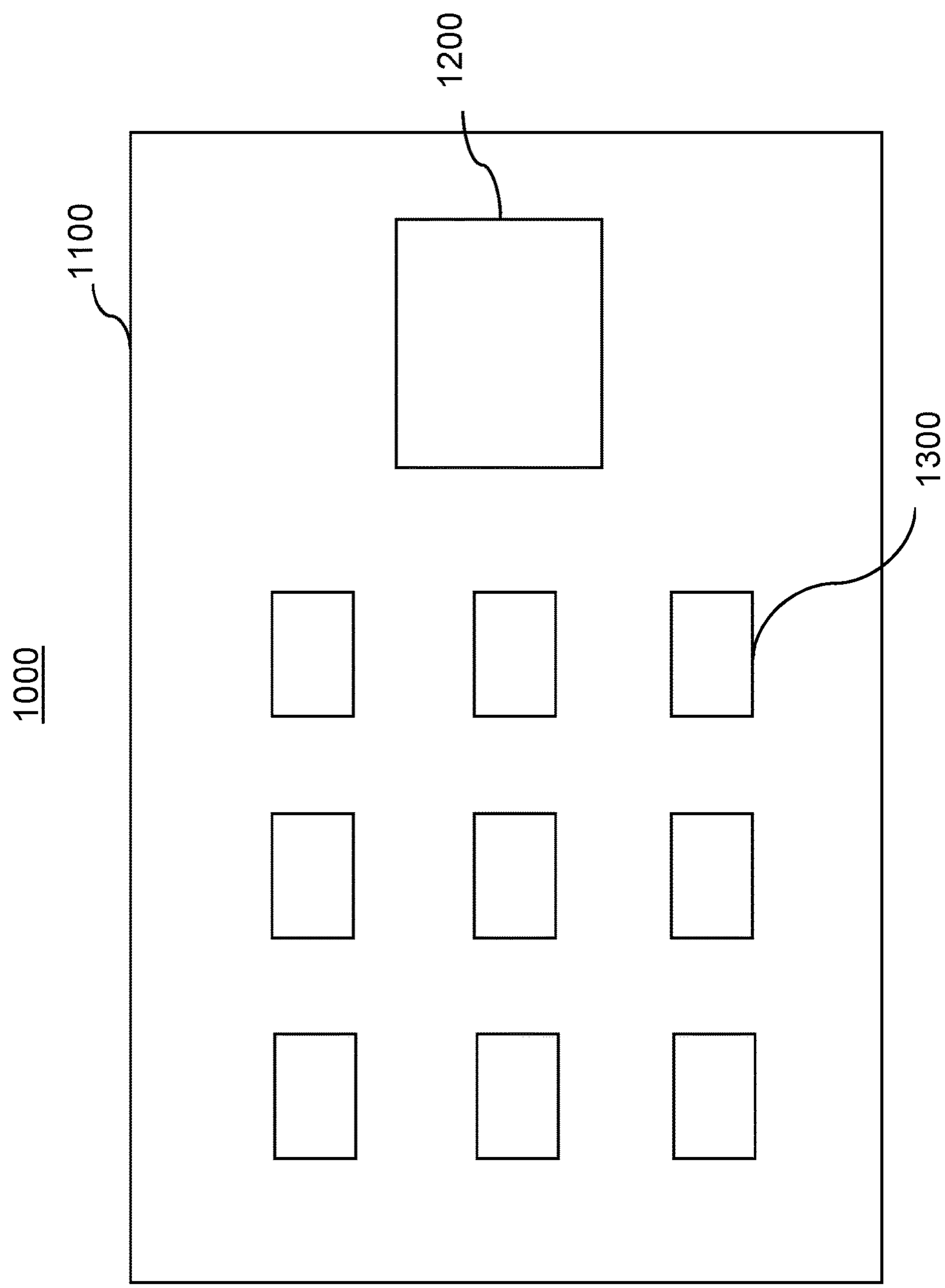
FIG. 10 illustrates a schematic plan view of a semiconductor module according to an embodiment.

FIG. 10 illustrates a schematic plan view of a semiconductor module according to an embodiment.

Referring to FIG. 10, a semiconductor module 1000 according to an embodiment may include a processor 1200 and semiconductor devices 1300 that are mounted on a module substrate 1100. The processor 1200 and/or the semiconductor devices 1300 may include one or more multi-stack semiconductor devices described in at least one of the above embodiments.

Figure 11:
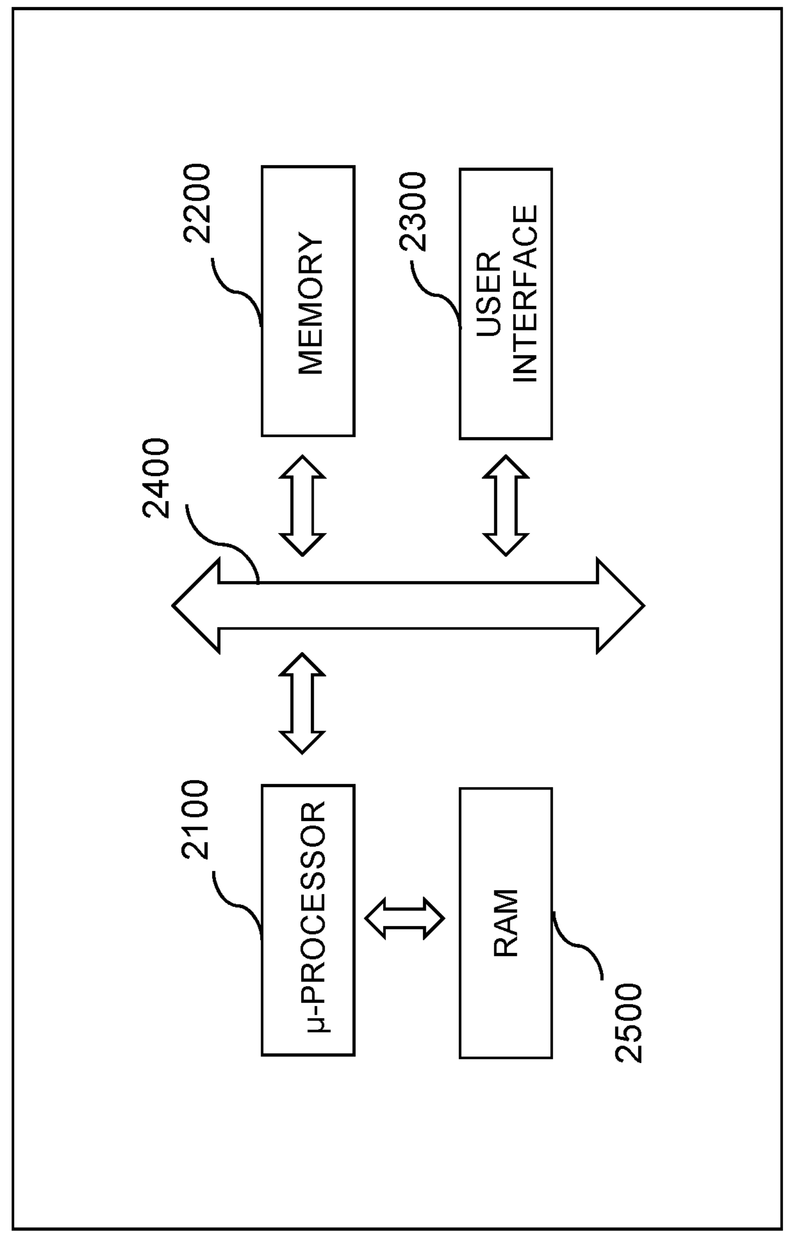
FIG. 11 illustrates a schematic block diagram of an electronic system according to an embodiment.

FIG. 11 illustrates a schematic block diagram of an electronic system according to an embodiment.

Referring to FIG. 11, an electronic system 2000 in accordance with an embodiment may include a microprocessor 2100, a memory 2200, and a user interface 2300 that perform data communication using a bus 2400. The microprocessor 2100 may include a central processing unit (CPU) or an application processor (AP). The electronic system 2000 may further include a random access memory (RAM) 2500 in direct communication with the microprocessor 2100. The microprocessor 2100 and/or the RAM 2500 may be implemented in a single module or package. The user interface 2300 may be used to input data to the electronic system 2000, or output data from the electronic system 2000. For example, the user interface 2300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 2200 may store operational codes of the microprocessor 2100, data processed by the microprocessor 2100, or data received from an external device. The memory 2200 may include a memory controller, a hard disk, or a solid state drive (SSD).

At least one of the microprocessor 2100, the memory 2200 and/or the RAM 2500 in the electronic system 2000 may include one or more of the multi-stack semiconductor devices described in at least one the above embodiments.

The foregoing is illustrative of example embodiments and is not to be construed as limiting thereof. Although a number of example embodiments have been described, those skilled in the art will readily appreciate that many modifications are possible in the above embodiments without materially departing from the inventive concept.

What is claimed is:

1. A multi-stack semiconductor device comprising:
a $1^{st}$ multi-stack transistor comprising a $1^{st}$ lower transistor and a $1^{st}$ upper transistor formed above the $1^{st}$ lower transistor;
a $2^{nd}$ multi-stack transistor comprising a $2^{nd}$ lower transistor and a $2^{nd}$ upper transistor formed above the $2^{nd}$ lower transistor, the $2^{nd}$ multi-stack transistor being disposed at a side of the $1^{st}$ multi-stack transistor in a $1^{st}$ direction; and
a diffusion break structure comprising:
a lower portion that separates the $1^{st}$ lower transistor from the $2^{nd}$ lower transistor; and
an upper portion that separates the $1^{st}$ upper transistor from the $2^{nd}$ upper transistor,
wherein the lower portion of the diffusion break structure has a material composition different from a material composition of the upper portion of the diffusion break structure,
wherein the material composition of the lower portion of the diffusion break structure has a characteristic of increasing one of compressive stress and tensile stress applied to the $1^{st}$ lower transistor and the $2^{nd}$ lower transistor, and
wherein the material composition of the upper portion of the diffusion break structure has a characteristic of increasing another of the compressive stress and the tensile stress applied to the $1^{st}$ upper transistor and the $2^{nd}$ upper transistor.

2. The multi-stack semiconductor device of claim 1, wherein one of the $1^{st}$ lower transistor and the $2^{nd}$ lower transistor is one of a p-type transistor and an n-type transistor, and
wherein another of the $1^{st}$ upper transistor and the $2^{nd}$ upper transistor is another of the p-type transistor and the n-type transistor.

3. The multi-stack semiconductor device of claim 2, wherein the material composition of the lower portion of the diffusion break structure comprises nitride, and the material composition comprises tonen silazene (TOSZ).

4. The multi-stack semiconductor device of claim 2, wherein the material composition of the lower portion of the diffusion break structure comprises a greater amount of nitride than the material composition of the upper portion of the diffusion break structure.

5. The multi-stack semiconductor device of claim 2,
wherein the multi-stack semiconductor device is formed across a plurality of gate pitches in the $1^{st}$ direction, and
wherein the diffusion break structure occupies a space corresponding to approximately one gate pitch or greater between the $1^{st}$ multi-stack transistor and the $2^{nd}$ multi-stack transistor in the $1^{st}$ direction.

6. The multi-stack semiconductor device of claim 5,
wherein the diffusion break structure forms a double diffusion break (DDB) structure that occupies a space corresponding to approximately two gate structures or dummy gate structures adjacent to each other and an active region therebetween in the $1^{st}$ direction, and
wherein the two gate structures or dummy gate structures adjacent to each other are formed between a gate structure of the $1^{st}$ multi-stack transistor and a gate structure of the $2^{nd}$ multi-stack transistor.

7. The multi-stack semiconductor device of claim 2,
wherein the multi-stack semiconductor device is formed to cover a plurality of gate pitches, and
wherein the diffusion break structure forms a single diffusion break (SDB) structure that occupies a space corresponding to approximately one gate structure or dummy gate structure between the $1^{st}$ multi-stack transistor and the $2^{nd}$ multi-stack transistor in the $1^{st}$ direction.

8. The multi-stack semiconductor device of claim 2, wherein each of the $1^{st}$ lower transistor and the $2^{nd}$ lower transistor is one of a p-type nanosheet transistor and an n-type nanosheet transistor, and
wherein each of the $1^{st}$ upper transistor and the $2^{nd}$ upper transistor is the other of the p-type nanosheet transistor and the n-type nanosheet transistor.

9. A semiconductor module comprising a processor and at least one semiconductor device on a module substrate, wherein one or more of the processor and the at least one semiconductor device comprises a multi-stack semiconductor device comprising:
a $1^{st}$ multi-stack transistor comprising a $1^{st}$ lower transistor and a $1^{st}$ upper transistor formed above the $1^{st}$ lower transistor;
a $2^{nd}$ multi-stack transistor comprising a $2^{nd}$ lower transistor and a $2^{nd}$ upper transistor formed above the $2^{nd}$ lower transistor, the $2^{nd}$ multi-stack transistor being disposed at a side of the $1^{st}$ multi-stack transistor in a $1^{st}$ direction; and
a diffusion break structure comprising:
a lower portion that separates the $1^{st}$ lower transistor from the $2^{nd}$ lower transistor; and
an upper portion that separates the $1^{st}$ upper transistor from the $2^{nd}$ upper transistor,
wherein the lower portion of the diffusion break structure has a material composition different from a material composition of the upper portion of the diffusion break structure,
wherein the material composition of the lower portion of the diffusion break structure has a characteristic of increasing one of compressive stress and tensile stress applied to the $1^{st}$ lower transistor and the $2^{nd}$ lower transistor, and
wherein the material composition of the upper portion of the diffusion break structure has a characteristic of increasing another of the compressive stress and the tensile stress applied to the $1^{st}$ upper transistor and the $2^{nd}$ upper transistor.

10. The semiconductor module of claim 9, wherein one of the $1^{st}$ lower transistor and the $2^{nd}$ lower transistor is one of a p-type transistor and an n-type transistor, and
wherein another of the $1^{st}$ upper transistor and the $2^{nd}$ upper transistor is another of the p-type transistor and the n-type transistor.

11. The semiconductor module of claim 10, wherein the material composition of the lower portion of the diffusion break structure comprises nitride, and the material composition comprises tonen silazene (TOSZ).

12. The semiconductor module of claim 10, wherein the material composition of the lower portion of the diffusion break structure comprises a greater amount of nitride than the material composition of the upper portion of the diffusion break structure.

13. The semiconductor module of claim 10, wherein the multi-stack semiconductor device is formed across a plurality of gate pitches in the $1^{st}$ direction, and
wherein the diffusion break structure occupies a space corresponding to approximately one gate pitch or greater between the $1^{st}$ multi-stack transistor and the $2^{nd}$ multi-stack transistor in the $1^{st}$ direction.

14. The semiconductor module of claim 13, wherein the diffusion break structure forms a double diffusion break (DDB) structure that occupies a space corresponding to approximately two gate structures or dummy gate structures adjacent to each other and an active region therebetween in the $1^{st}$ direction, and
wherein the two gate structures or dummy gate structures adjacent to each other are formed between a gate structure of the $1^{st}$ multi-stack transistor and a gate structure of the $2^{nd}$ multi-stack transistor.

15. The semiconductor module of claim 10,
wherein the multi-stack semiconductor device is formed to cover a plurality of gate pitches, and
wherein the diffusion break structure forms a single diffusion break (SDB) structure that occupies a space corresponding to approximately one gate structure or dummy gate structure between the $1^{st}$ multi-stack transistor and the $2^{nd}$ multi-stack transistor in the $1^{st}$ direction.

16. The semiconductor module of claim 10, wherein each of the $1^{st}$ lower transistor and the $2^{nd}$ lower transistor is one of a p-type nanosheet transistor and an n-type nanosheet transistor, and
wherein each of the $1^{st}$ upper transistor and the $2^{nd}$ upper transistor is the other of the p-type nanosheet transistor and the n-type nanosheet transistor.

17. An electronic system comprising a processor and at least one memory device that are communicatively coupled by a data bus, wherein one or more of the processor and the at least one memory comprises a multi-stack semiconductor device comprising:
a $1^{st}$ multi-stack transistor comprising a $1^{st}$ lower transistor and a $1^{st}$ upper transistor formed above the $1^{st}$ lower transistor;
a $2^{nd}$ multi-stack transistor comprising a $2^{nd}$ lower transistor and a $2^{nd}$ upper transistor formed above the $2^{nd}$ lower transistor, the $2^{nd}$ multi-stack transistor being disposed at a side of the $1^{st}$ multi-stack transistor in a $1^{st}$ direction; and
a diffusion break structure comprising:
a lower portion that separates the $1^{st}$ lower transistor from the $2^{nd}$ lower transistor; and an upper portion that separates the $1^{st}$ upper transistor from the $2^{nd}$ upper transistor, wherein the lower portion of the diffusion break structure has a material composition different from a material composition of the upper portion of the diffusion break structure, wherein the material composition of the lower portion of the diffusion break structure has a characteristic of increasing one of compressive stress and tensile stress applied to the $1^{st}$ lower transistor and the $2^{nd}$ lower transistor, and wherein the material composition of the upper portion of the diffusion break structure has a characteristic of increasing another of the compressive stress and the tensile stress applied to the $1^{st}$ upper transistor and the $2^{nd}$ upper transistor.

18. The electronic system of claim 17, wherein one of the 1st lower transistor and the $2^{nd}$ lower transistor is one of a p-type transistor and an n-type transistor, and wherein another of the $1^{st}$ upper transistor and the $2^{nd}$ upper transistor is another of the p-type transistor and the n-type transistor.

19. The electronic system of claim 18, wherein the material composition of the lower portion of the diffusion break structure comprises nitride, and the material composition comprises tonen silazene (TOSZ).

20. The electronic system of claim 18, wherein the material composition of the lower portion of the diffusion break structure comprises a greater amount of nitride than the material composition of the upper portion of the diffusion break structure.

* * * * *